(12) United States Patent
Endo et al.

(10) Patent No.: US 11,719,767 B2
(45) Date of Patent: Aug. 8, 2023

(54) MAGNETIC SENSOR

(71) Applicant: SHOWA DENKO K.K., Tokyo (JP)

(72) Inventors: Daizo Endo, Ichihara (JP); Hiroyuki Tomita, Ichihara (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 17/457,299

(22) Filed: Dec. 2, 2021

(65) Prior Publication Data

US 2022/0196762 A1    Jun. 23, 2022

(30) Foreign Application Priority Data

Dec. 22, 2020 (JP) ................ 2020-212026

(51) Int. Cl.
*G01R 33/60* (2006.01)
*G01R 33/06* (2006.01)

(52) U.S. Cl.
CPC ................ *G01R 33/063* (2013.01)

(58) Field of Classification Search
CPC ........... G01R 33/00; G01R 33/0035; G01R 33/0023; G01R 33/0017; G01R 31/3191; G01R 33/063; G01B 7/004; G01C 17/38; G06F 3/017; G06F 3/0346; G06F 3/012
See application file for complete search history.

(56) References Cited

U.S. PATENT DOCUMENTS

| 6,344,742 | B1 | 2/2002 | Kobayashi et al. |
| 6,563,679 | B1 | 5/2003 | Li et al. |
| 2010/0156405 | A1* | 6/2010 | Furukawa ............ B82Y 25/00 324/252 |
| 2015/0028863 | A1 | 1/2015 | Zeyen |
| 2021/0141035 | A1* | 5/2021 | Endo ................ G01R 33/0052 |

FOREIGN PATENT DOCUMENTS

| CN | 107462846 A | 12/2017 |
| EP | 0 916 961 A2 | 5/1999 |
| EP | 3 640 659 A1 | 4/2020 |
| EP | 3640659 A1 * | 4/2020 ......... G01R 33/0052 |
| JP | 2008-249406 A | 10/2008 |
| WO | 2018/230116 A1 | 12/2018 |

OTHER PUBLICATIONS

Search Report dated Mar. 30, 2022 in counterpart GB Application No. GB 2117540.1.

* cited by examiner

Primary Examiner — Patrick Assouad
Assistant Examiner — Taqi R Nasir
(74) Attorney, Agent, or Firm — Sughrue Mion, PLLC

(57) ABSTRACT

The sensitivity of a magnetic sensor using a sensitive element sensing a magnetic field by the magnetic impedance effect is increased. The magnetic sensor includes: a sensitive element sensing a magnetic field by a magnetic impedance effect; and a focusing member provided to face the sensitive element, configured with a soft magnetic material, and focusing magnetic force lines from outside onto the sensitive element.

15 Claims, 13 Drawing Sheets

MAGNETIC SENSOR

CROSS REFERENCE TO RELATED APPLICATIONS

This application is based on and claims priority under 35 USC § 119 to Japanese Patent Application No. 2020-212026 filed Dec. 22, 2020, the disclosure is incorporated herein by reference in its entirety.

BACKGROUND

Technical Field

The present invention relates to a magnetic sensor.

Related Art

As a related art described in a gazette, there is a magnetic impedance effect element including: a thin film magnet configured with a hard magnetic material film formed on a nonmagnetic substrate; an insulating layer covering the top of the thin film magnet; and a magneto-sensitive part formed on the insulating layer and configured with one or plural rectangular soft magnetic material films provided with uniaxial anisotropy (refer to Japanese Patent Application Laid-Open Publication No. 2008-249406).

A magnetic sensor using a sensitive element that senses a magnetic field by the magnetic impedance effect is required to have a high sensitivity to changes in the magnetic field.

An object of the present invention is to increase sensitivity of a magnetic sensor using a sensitive element sensing a magnetic field by the magnetic impedance effect.

SUMMARY

A magnetic sensor to which the present invention is applied includes: a sensitive element sensing a magnetic field by a magnetic impedance effect; and a focusing member provided to face the sensitive element, configured with a soft magnetic material, and focusing magnetic force lines from outside onto the sensitive element.

In such a magnetic sensor, in the focusing member, a width of a side where the magnetic force lines enter from the outside may be wider than a width of a side facing the sensitive element in a direction intersecting a direction of the magnetic force lines of the outside.

Then, the focusing member may include: a facing part facing the sensitive element; and a wide part provided on a side where the magnetic force lines enter from the outside, a width thereof in a direction intersecting a direction of the magnetic force lines in the outside is wider than a width of the facing part.

Alternatively, the focusing member may include: a facing part facing the sensitive element; a wide part provided on a side where the magnetic force lines enter from the outside, a width thereof in a direction intersecting a direction of the magnetic force lines in the outside is wider than a width of the facing part; and an extending part extending from an end portion of the wide part toward the sensitive element.

Such a magnetic sensor may further include: a bias magnetic field application member provided in contact with or nearby the focusing member to apply a bias magnetic field to the sensitive element via the focusing member.

Moreover, the magnetic sensor to which the present invention is applied may further include: a diverging member provided to face the sensitive element, configured with a soft magnetic material, and diverging the magnetic force lines passed through the sensitive element to the outside.

In such a magnetic sensor, in the diverging member, a width of a side where the magnetic force lines exit to the outside may be wider than a width of a side facing the sensitive element in a direction intersecting a direction of the magnetic force lines in the outside.

Then, the diverging member may include: a facing part facing the sensitive element; and a wide part provided on a side where the magnetic force lines exit to the outside, a width thereof in a direction intersecting a direction of the magnetic force lines in the outside is wider than a width of the facing part.

Alternatively, the diverging member may include: a facing part facing the sensitive element; a wide part provided on a side where the magnetic force lines exit to the outside, a width thereof in a direction intersecting a direction of the magnetic force lines in the outside is wider than a width of the facing part; and an extending part extending from an end portion of the wide part toward the sensitive element.

Such a magnetic sensor may further include: a bias magnetic field application member provided in contact with or nearby the diverging member to apply a bias magnetic field to the sensitive element via the diverging member.

Moreover, the sensitive element may include a substrate and a sensitive circuit, and the focusing member and the diverging member are provided outside the substrate.

According to the present invention, it is possible to increase sensitivity of a magnetic sensor using a sensitive element sensing a magnetic field by the magnetic impedance effect.

BRIEF DESCRIPTION OF THE DRAWINGS

Exemplary embodiments of the present invention will be described in detail based on the following figures, wherein:

FIG. 3A is a plan view and FIG. 3B is a cross-sectional view along the IIIB-IIIB line in FIG. 3A;

FIG. 7A shows a magnetic sensor including a focusing member and a diverging member with a trapezoidal planar shape, and FIG. 7B shows a magnetic sensor including a focusing member and a diverging member with a Y-shaped planar shape;

FIG. 10A shows a magnetic sensor including "T-type" focusing member and diverging member, to which a bias magnetic field is applied by a permanent magnet, and FIG. 10B shows a magnetic sensor, to which a bias magnetic field is applied by a bonded magnet;

FIG. 11A shows time variation in the voltage of the sensitive element, and FIG. 11B shows FFT data that is the time variation of the voltage subjected to fast Fourier transform (FFT);

FIG. 12A shows time variation in the voltage of the sensitive element, and FIG. 12B shows FFT data that is the time variation of the voltage subjected to fast Fourier transform (FFT)

DETAILED DESCRIPTION

Hereinafter, exemplary embodiments according to the present invention will be described with reference to attached drawings.

First Exemplary Embodiment (Magnetic Sensors 200 and 210)

Figure 1:
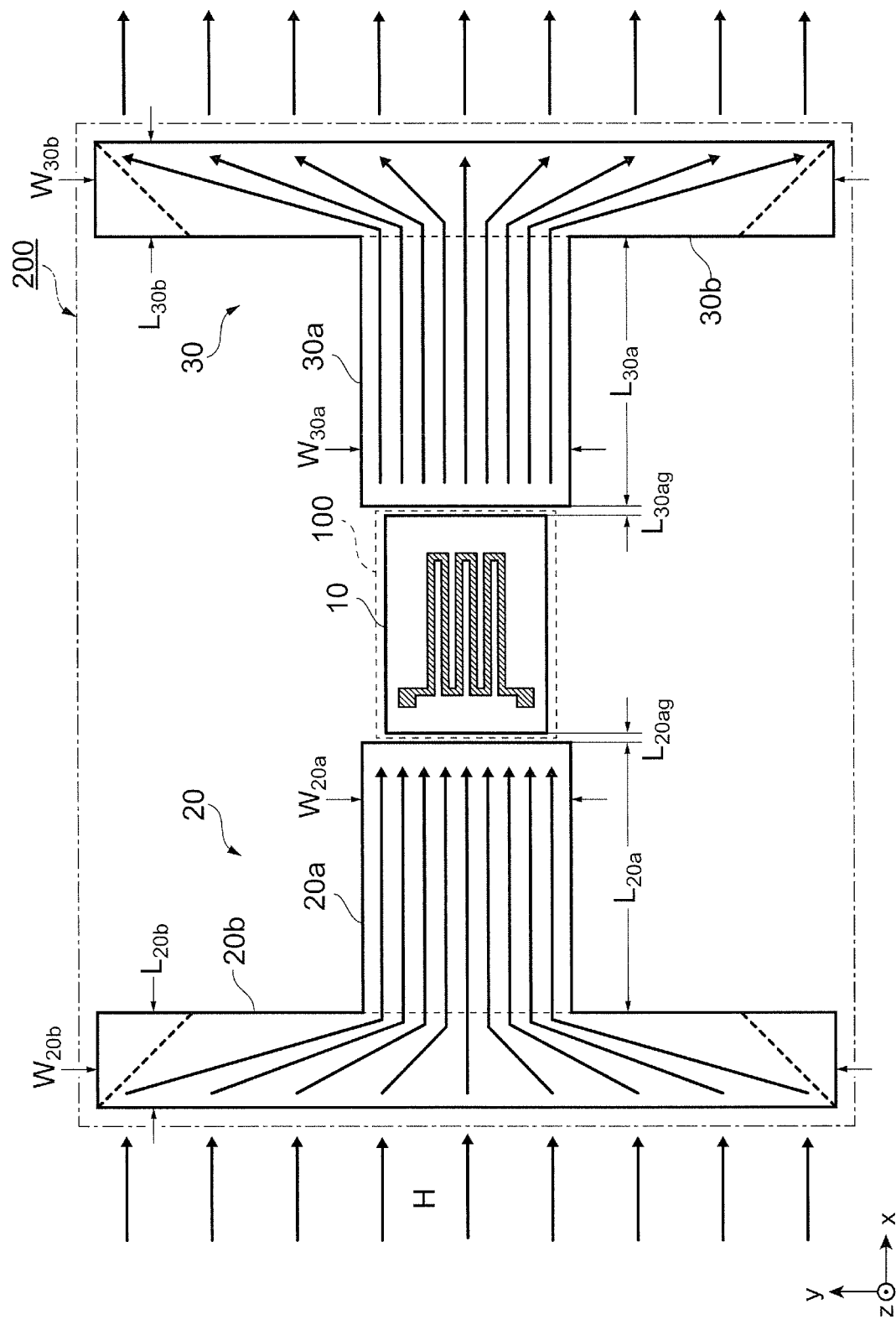
FIG. 1 illustrates a magnetic sensor to which a first exemplary embodiment is applied.

FIG. 1 illustrates a magnetic sensor 200, to which the first exemplary embodiment is applied. As shown in FIG. 1, it is assumed that the horizontal direction of the page is the x direction, the vertical direction of the page is the y direction, and the front side direction of the page is the z direction. Note that FIG. 1 shows magnetic force lines with arrows.

The magnetic sensor 200 includes: a sensitive element 10; a focusing member 20 that focuses the magnetic force lines from external space to the sensitive element 10; and a diverging member 30 that diverges the magnetic force lines passed through the sensitive element 10. Then, the focusing member 20, the sensitive element 10, and the diverging member 30 are arranged in the x direction in this order. Here, the magnetic sensor 200 refers to the portion enclosed by a long-dot-and-dash line shown in FIG. 1, and other than this is referred to as external space or outside. The same is true in other cases.

The sensitive element 10 senses the magnetic field or changes in the magnetic field in the x direction by the magnetic impedance effect.

The focusing member 20 includes a facing part 20a that faces the sensitive element 10, and a wide part 20b that is wider in the y direction than the facing part 20a. In other words, the focusing member 20 has a T shape in a planar shape, in which the facing part 20a serves as a vertical bar and the wide part 20b serves as a horizontal bar. The focusing member 20 has a constant thickness in the z direction.

In the focusing member 20, the width $W_{20a}$ (in the y direction) of the portion in the facing part 20a facing the sensitive element 10 is, for example, 4.5 mm, the length $L_{20a}$ in the x direction is, for example, 6 mm, the width $W_{20b}$ in the y direction of the wide part 20b is, for example, 16 mm, and the length $L_{20b}$ in the x direction is, for example, 2 mm. Further, the distance $L_{20ag}$ between the facing part 20a and the sensitive element 10 is, for example, 2 mm. Note that these values are a mere example, and any other values may be adopted.

The diverging member 30 includes a facing part 30a that faces the sensitive element 10, and a wide part 30b that is wider in the y direction than the facing part 30a. In other words, similar to the focusing member 20, the diverging member 30 has a T shape in a planar shape. The diverging member 30 has a constant thickness in the z direction.

In the diverging member 30, the width $W_{30a}$ (in the y direction) of the portion in the facing part 30a facing the sensitive element 10 is, for example, 4.5 mm, the length $L_{30a}$ in the x direction is, for example, 6 mm, the width $W_{30b}$ in the y direction of the wide part 30b is, for example, 16 mm, and the length $L_{30b}$ in the x direction is, for example, 2 mm. Further, the distance $L_{30ag}$ between the facing part 30a and the sensitive element 10 is, for example, 2 mm. Note that these values are a mere example, and any other values may be adopted.

To additionally describe, the magnetic sensor 200 includes the wide part 20b and the facing part 20a of the focusing member 20, the sensitive element 10, the facing part 30a and the wide part 30b of the diverging member 30 arranged in the x direction in this order. Then, the focusing member 20 and the diverging member 30 have the same T-shaped planar shape and are arranged symmetrically about the sensitive element 10 in the x direction. Hereinafter, the magnetic sensor 200 is referred to as including the "T-type" focusing member 20 and diverging member 30.

Note that, in the focusing member 20 shown in FIG. 1, the facing part 20a is provided at the center portion of the wide part 20b in the y direction. However, the facing part 20a does not need to be provided at the center portion of the wide part 20b, and may be provided at the end portion of the wide part 20b in the y direction or at the end portion of the wide part 20b in the −y direction. In other words, the focusing member 20 may have an L-shaped planar shape ("L-type"). This holds true for the diverging member 30.

The focusing member 20 and the diverging member 30 are configured with a soft magnetic material. The soft magnetic material has a small, so-called coercive force, the soft magnetic material being easily magnetized by a magnetic field, but, upon removal of the magnetic field, quickly returning to a state with no magnetization or a little magnetization. Here, the focusing member 20 and the diverging member 30 are composed of ferrite, as an example. Examples of such ferrite include those made of MnZn, with an initial permeability of 2500±25% and a saturation magnetic flux density Bs of 420 mT. Then, the facing part 20a and the wide part 20b of the focusing member 20 are configured as one piece, and the facing part 30a and the wide part 30b of the diverging member 30 are configured as one piece.

As shown in FIG. 1, the magnetic force lines from the external space enter the wide part 20b of the focusing member 20 from the left side of the page (from the −x direction) and are focused while proceeding from the wide part 20b to the facing part 20a and exit from the facing part 20a. Then, the magnetic force lines passed through the sensitive element 10 enter the facing part 30a of the diverging member 30. The magnetic force lines then diverge as proceeding from the facing part 30a to the wide part 30b and exit from the wide part 30b to the external space. In other words, the magnetic force lines from the external space are focused by the focusing member 20, and the magnetic flux density, which is the density of the magnetic force lines, is increased to pass through the sensitive element 10. Note that FIG. 1 shows the magnetic field in the external space (referred to as the external magnetic field) as the magnetic field H.

The diverging member 30 has the same planar shape as the focusing member 20 and is arranged symmetrically to the focusing member 20 about the sensitive element 10 in the x direction. The diverging member 30 is provided so that the magnetic force lines focused by the focusing member 20 pass through the sensitive element 10 in the focused state. In other words, by providing the diverging member 30, the magnetic force lines become easier to pass through the sensitive element 10 in parallel. Consequently, the magnetic field in the external space is intensified to be applied to the sensitive element 10.

Note that, if the predetermined sensitivity can be obtained in the magnetic sensor 200, it is unnecessary to have the diverging member 30.

As described above, it is sufficient that the focusing member 20 can focus the magnetic force lines from the external space. For this reason, in the focusing member 20, it is sufficient that the width $W_{20b}$ on the wide part 20b side (in the −x direction) where the magnetic force lines from the external space enter is wider than the width $W_{20a}$ on the facing part 20a side (in the +x direction) where the focused magnetic force lines exit to the sensitive element 10 ($W_{20a} < W_{20b}$).

In addition, it is sufficient that the diverging member 30 can diverge the magnetic force lines to the external space. For this reason, in the diverging member 30, it is sufficient that the width $W_{30a}$ on the facing part 30a side (in the −x direction) where the magnetic force lines from the sensitive element 10 enter is narrower than the width $W_{30b}$ on the wide part 30b side where the diverged magnetic force lines exit ($W_{30a} < W_{30b}$).

Note that, in FIG. 1, the −x direction side of the wide part 20b of the focusing member 20 is disposed perpendicular (90°) to the magnetic force lines from the external space heading in the x direction. However, the end portion of the wide part 20b of the focusing member 20 may not be disposed perpendicular to the magnetic force lines from the external space; it is sufficient that the wide part 20b is provided 45° or more and 90° or less to the magnetic force lines. Note that, this also holds true for the diverging member 30.

Moreover, as shown by the broken lines in FIG. 1, the wide part 20b of the focusing member 20 and the wide part 30b of the diverging member 30 in the magnetic sensor 200 may have end portions in the ±y direction inclined toward the sensitive element 10. The portions obliquely removed are portions where the magnetic force lines are difficult to pass through in the case in which the magnetic force lines are heading from the wide part 20b toward the facing part 20a in the focusing member 20 or in the case in which the magnetic force lines are heading from the facing part 30a toward the wide part 30b in the diverging member 30. Consequently, even if the end portions of the wide part 20b of the focusing member 20 and end portions of the wide part 30b of the diverging member 30 in the ±y direction are obliquely inclined toward the sensitive element 10, the properties to focus or diverge the magnetic force lines are less affected.

Here, for the purpose of comparison, a sensitive element 10 that does not include the focusing member 20 and the diverging member 30 is referred to as a magnetic sensor 100. Note that, when the magnetic sensors 100 and 200 are not distinguished, each of these is referred to as the magnetic sensor. The same applies for the magnetic sensors to be described later.

Figure 2:
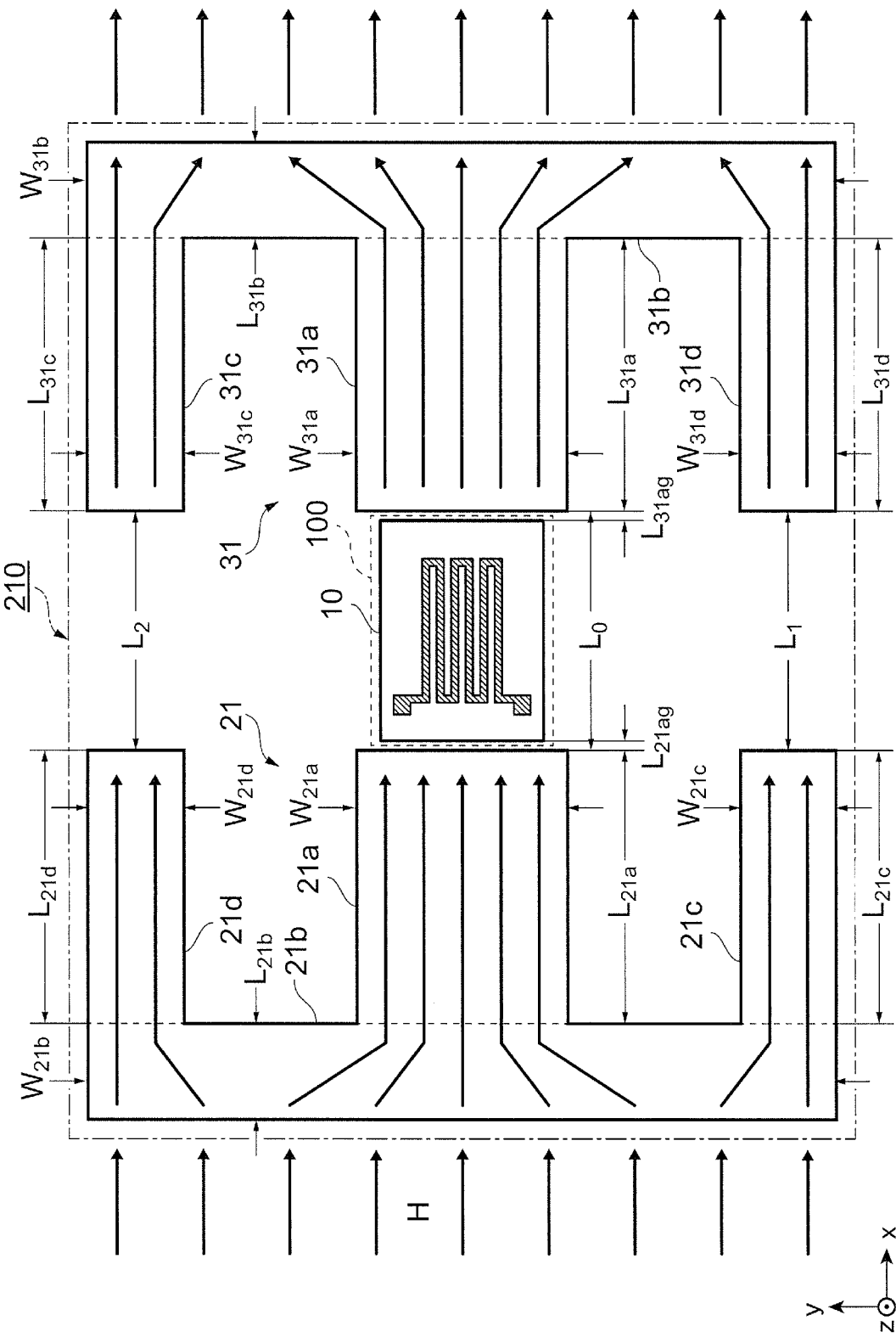
FIG. 2 illustrates another magnetic sensor to which the first exemplary embodiment is applied.

FIG. 2 illustrates another magnetic sensor 210, to which the first exemplary embodiment is applied.

The magnetic sensor 210 includes: a sensitive element 10; a focusing member 21 that focuses the magnetic force lines from external space to the sensitive element 10; and a diverging member 31 that diverges the magnetic force lines passed through the sensitive element 10. Then, the focusing member 21, the sensitive element 10, and the diverging member 31 are arranged in the x direction in this order.

The sensitive element 10 is the same as the sensitive element 10 of the magnetic sensor 200.

The focusing member 21 includes a facing part 21a that faces the sensitive element 10, a wide part 21b that is wider in the y direction than the facing part 21a, and extending parts 21c and 21d each extending in the x direction from one of both end portions of the wide part 21b. Note that the extending parts 21c and 21d are parallel to the facing part 21a. In other words, the focusing member 21 has an E shape in a planar shape, in which the wide part 21b serves as a vertical bar and the facing part 21a, the extending parts 21c and 21d serve as respective horizontal bars. The focusing member 21 has a constant thickness in the z direction. Note that the facing part 21a and the wide part 21b are similar to the facing part 20a and the wide part 20b in the magnetic sensor 200.

In the focusing member 21, the width $W_{21a}$ (in the y direction) and the length $L_{21a}$ in the x direction of the portion of the facing part 21a that faces the sensitive element 10 are equal to the width $W_{20a}$ and the length $L_{20a}$ in the x direction of the facing part 20a in the magnetic sensor 200, respectively. The width $W_{21b}$ in the y direction and the length $L_{21b}$ in the x direction of the wide part 21b are equal to the width $W_{20b}$ and the length $L_{20b}$ in the x direction of the wide part 20b in the magnetic sensor 200, respectively. The width $W_{21c}$ in the y direction of the extending part 21c and the width $W_{21d}$ in the y direction of the extending part 21d are, for example, 2 mm, and the length $L_{21c}$ in the x direction of the extending part 21c and the length $L_{21d}$ in the x direction of the extending part 21d are, for example, 6 mm. Further, the distance $L_{21ag}$ between the facing part 21a and the sensitive element 10 is equal to the distance $L_{20ag}$ between the facing part 20a of the focusing member 20 and the sensitive element 10 in the magnetic sensor 200. Note that these values are a mere example, and any other values may be adopted.

The diverging member 31 includes a facing part 31a that faces the sensitive element 10, a wide part 31b that is wider in they direction than the facing part 31a, and extending parts 31c and 31d each extending in the −x direction from one of both end portions of the wide part 31b. Note that the extending parts 31c and 31d are parallel to the facing part 31a. In other words, similar to the focusing member 21, the diverging member 31 has an E shape in a planar shape. The diverging member 31 has a constant thickness in the z direction. Note that the facing part 31a and the wide part 31b are similar to the facing part 30a and the wide part 30b in the magnetic sensor 200.

In the diverging member 31, the width $W_{31a}$ (in the y direction) and the length $L_{31a}$ in the x direction of the portion of the facing part 31a that faces the sensitive element 10 are equal to the width $W_{30a}$ and the length $L_{30a}$ in the x direction of the facing part 30a in the magnetic sensor 200, respectively. The width $W_{31b}$ in the y direction and the length $L_{31b}$ in the x direction of the wide part 31b are equal to the width $W_{30b}$ and the length $L_{30b}$ in the x direction of the wide part 30b in the magnetic sensor 200, respectively. The width $W_{31c}$ in the y direction of the extending part 31c and the width $W_{31d}$ in the y direction of the extending part 31d are, for example, 2 mm, and the length $L_{31c}$ in the x direction of the extending part 31c and the length $L_{31d}$ in the x direction of the extending part 31d are, for example, 6 mm. Further, the distance $L_{31ag}$ between the facing part 31a and the sensitive element 10 is equal to the distance $L_{30ag}$ between the facing part 30a of the diverging member 30 and the sensitive element 10 in the magnetic sensor 200. Note that these values are a mere example, and any other values may be adopted.

To additionally describe, the magnetic sensor 210 includes the wide part 21b and the facing part 21a of the focusing member 21, the sensitive element 10, the facing part 31a and the wide part 31b of the diverging member 31 arranged in the x direction in this order. Then, the focusing member 21 and the diverging member 31 have the same E-shaped planar shape and are arranged symmetrically about the sensitive element 10 in the x direction. Hereinafter, the magnetic sensor 210 is referred to as including the "E-type" focusing member 21 and diverging member 31.

Note that, in the focusing member 21 shown in FIG. 2, the facing part 21a is provided at the center portion of the wide part 21b in the y direction, and the extending parts 21c and 21d are provided at respective end portions of the wide part 21b in the ±y direction. However, the facing part 20a may be provided in the +y direction or the −y direction away from the center portion of the wide part 20b. In addition, one of the extending parts 21c and 21d may not be provided. In other words, in the focusing member 21, the facing part 21a may be provided at one end portion of the wide part 21b, and the extending part 21c or 21d may be provided at the other end portion of the wide part 21b. That is to say, the focusing member 21 may have a C-shaped planar shape ("C-type"). This holds true for the diverging member 31.

As shown in FIG. 2, the magnetic force lines from the external space enter the wide part 21b of the focusing member 21 from the left side of the page (from the −x direction), and a part thereof is focused while proceeding from the wide part 21b to the facing part 21a and exits from the facing part 21a. Note that the other parts of the magnetic force lines that have entered the wide part 21b of the focusing member 21 are focused while proceeding to the extending parts 21c and 21d, and exit from the extending parts 21c and 21d. Then, the magnetic force lines exited from the facing part 21a pass through the sensitive element 10 to enter the facing part 31a of the diverging member 31. In addition, each of the magnetic force lines exited from the extending parts 21c and 21d enters the extending parts 31d and 31c of the diverging member 31. The magnetic force lines then diverge as proceeding from the facing part 31a, the extending parts 31c and 31d to the wide part 31b, and exit from the wide part 31b to the external space. In other words, the magnetic force lines from the external space are focused by the focusing member 21, and the magnetic flux density, which is the density of the magnetic force lines, is increased to pass through the sensitive element 10. Note that FIG. 2 shows the magnetic field in the external space (referred to as the external magnetic field) as the magnetic field H.

As described above, it is sufficient that the focusing member 21 can focus the magnetic force lines from the external space onto the facing part 21a. For this reason, in the focusing member 21, it is sufficient that the width $W_{21b}$ on the wide part 21b side (in the −x direction) where the magnetic force lines from the external space enter is wider than the width $W_{21a}$ on the facing part 21a side (in the +x direction) where the focused magnetic force lines exit to the sensitive element 10 ($W_{21a} < W_{21b}$).

In addition, it is sufficient that the diverging member 31 can diverge the magnetic force lines to the external space. For this reason, in the diverging member 31, it is sufficient that the width $W_{31a}$ on the facing part 31a side (in the −x direction) where the magnetic force lines from the sensitive element 10 enter is narrower than the width $W_{31b}$ on the wide part 31b side (in the x direction) where the diverged magnetic force lines exit ($W_{31a} < W_{31b}$).

Note that it is preferable that the distance $L_0$ between the facing part 21a of the focusing member 21 and the facing part 31a of the diverging member 31 is equal to or less than the distance $L_1$ between the extending part 21c of the focusing member 21 and the extending part 31d of the diverging member 31 and the distance $L_2$ between the extending part 21d of the focusing member 21 and the extending part 31c of the diverging member 31 ($L_0 \leq L_1, L_2$). This means that if the distance $L_1$ and/or the distance $L_2$ is less than the distance $L_0$, the magnetic resistance between (of the gap of) the extending part 21c and the extending part 31d and/or the magnetic resistance between (of the gap of) the extending part 21d and the extending part 31c becomes less than that between the facing part 21a and the facing part 31a. For this reason, the magnetic force lines easily concentrate on the side between (of the gap of) the extending part 21c and the extending part 31d and/or the extending part 21d and the extending part 31c, and thereby the magnetic field to be applied to the sensitive element 10 provided between the facing part 21a and the facing part 31a is reduced.

Then, the diverging member 31 has the same planar shape as the focusing member 21 and is arranged symmetrically to the focusing member 21 about the sensitive element 10 in the x direction. This is due to the same reason as described for the magnetic sensor 200. Consequently, if the predetermined sensitivity can be obtained in the magnetic sensor 210, it is unnecessary to have the diverging member 31.

Hereinafter, in the case where the focusing member 20 of the magnetic sensor 200 and the focusing member 21 of the magnetic sensor 210 are not distinguished, each of those is referred to as the focusing member. Similarly, in the case where the diverging member 30 of the magnetic sensor 200 and the diverging member 31 of the magnetic sensor 210 are not distinguished, each of those is referred to as the diverging member. The same is true in other cases.

(Sensitive Element 10)

Figure 3A:
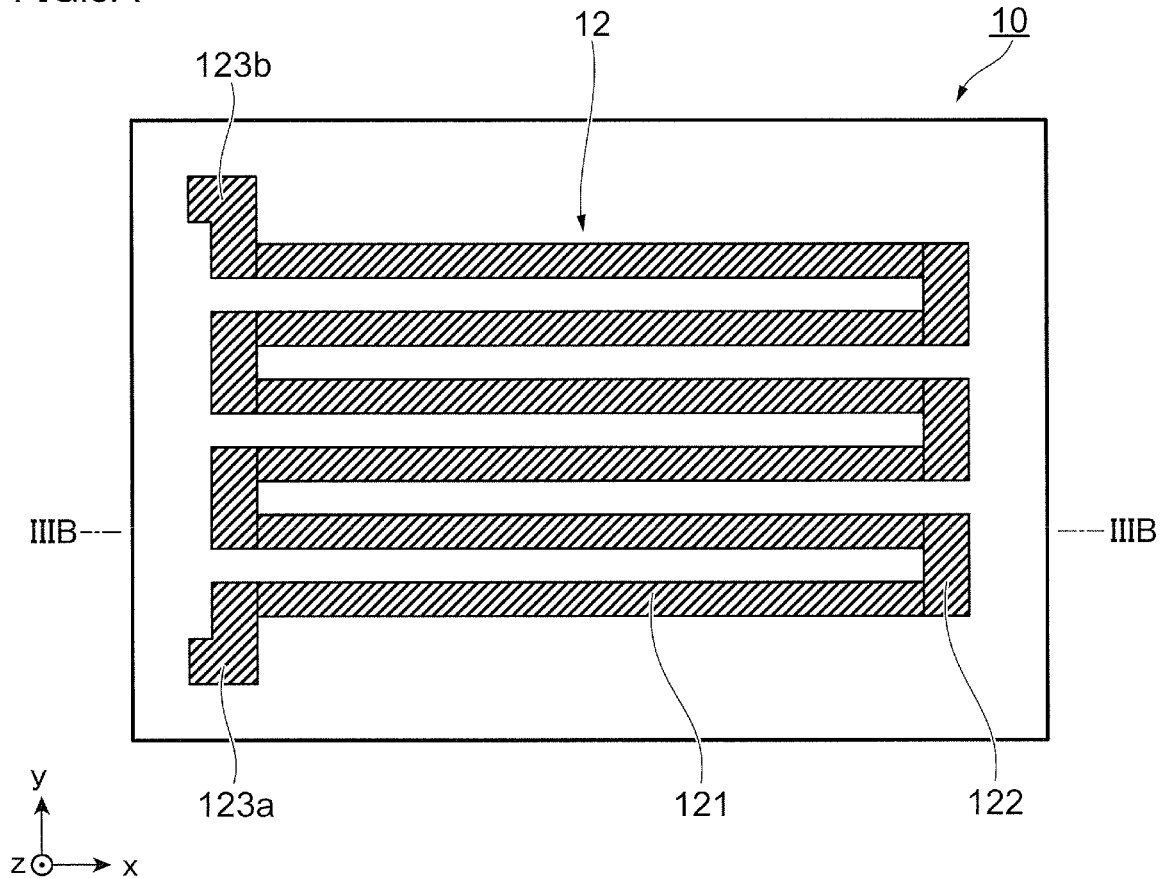
FIGS. 3A and 3B illustrate an example of a sensitive element, where
Figure 3B:
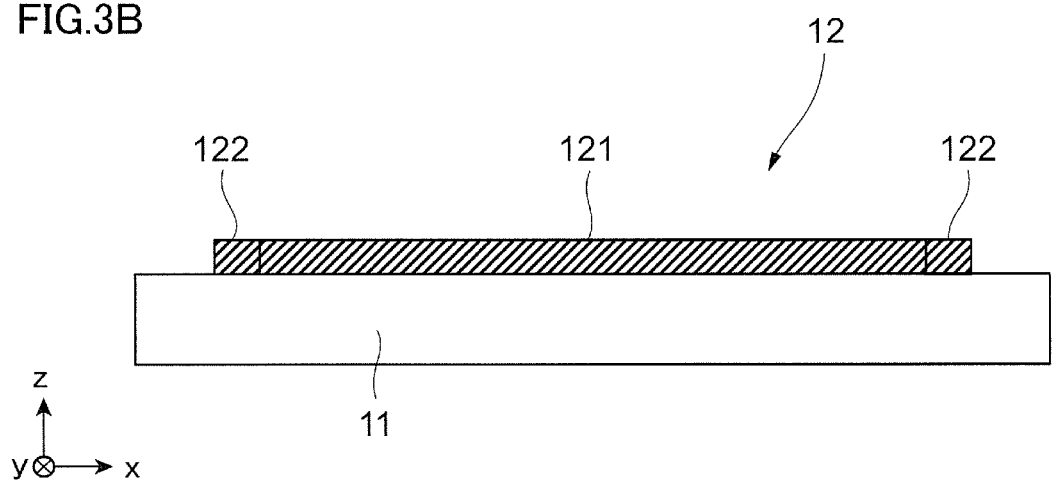

FIGS. 3A and 3B illustrate an example of the sensitive element 10. FIG. 3A is a plan view and FIG. 3B is a cross-sectional view along the IIIB-IIIB line in FIG. 3A. In FIG. 3A, the horizontal direction of the page is the x direction, the vertical direction of the page is the y direction, and the front side direction of the page is the z direction. In FIG. 3B, the horizontal direction of the page is the x direction, the vertical direction of the page is the z direction, and the backside direction of the page is the y direction.

With reference to the cross-sectional view in FIG. 3B, the cross-sectional structure of the sensitive element 10 will be described. The sensitive element 10 includes: a substrate 11; and a sensitive circuit 12 provided on the substrate 11.

With reference to the plan view in FIG. 3A, the planar structure of the sensitive element 10 will be described. The sensitive element 10 has a quadrangular planar shape as an example. The planar shape of the sensitive element 10 is several millimeters square. For example, the length in the x direction is 4 mm to 6 mm, and the length in the y direction is 3 mm to 5 mm. Note that the size of the planar shape of the sensitive element 10 may be other values.

The sensitive circuit 12 includes: plural sensitive parts 121; connection parts 122 each serially connecting the sensitive parts 121 windingly; and terminal parts 123 provided at one end portion and the other end portion of the sensitive parts 121 connected in series.

The sensitive part 121 has a reed-shaped planar shape with a longitudinal direction and a short direction. It is assumed that, in the sensitive part 121 shown in FIG. 3A, the x direction is the longitudinal direction, and the y direction is the short direction. In FIG. 3A, the six sensitive parts 121 are arranged in parallel in the y direction. The sensitive part 121 is provided with uniaxial magnetic anisotropy in a direction crossing the longitudinal direction, for example, an intersecting short direction (the width direction). Note that the direction crossing the longitudinal direction may have an angle exceeding 45° with respect to the longitudinal direction. Consequently, the sensitive part 121 shows the magnetic impedance effect. Therefore, the sensitive element 10 or the sensitive circuit 12 is sometimes referred to as a magnetic impedance element.

Each sensitive part 121 has, for example, the length in the longitudinal direction of 1 mm to 10 mm, and the width in the short direction of 50 μm to 150 μm. The thickness thereof is 0.2 μm to 5 μm. The intervals between the adjacent sensitive parts 121 are 50 μm to 150 μm. The number of sensitive parts 121 is, for example, 18.

Note that the size of each sensitive part 121 (the length, the area, the thickness, etc.), the number of sensitive parts 121, the intervals between the sensitive parts 121, or the like may be set in accordance with the magnitude of the magnetic field to be sensed, in other words, to be measured. Note that the number of the sensitive parts 121 may be one.

The connection part 122 is provided between end portions of the adjacent sensitive parts 121 to connect the plural sensitive parts 121 in series. In other words, the connection parts 122 are provided to connect the adjacent sensitive parts 121 windingly (so called meander shape). In the sensitive element 10 with six sensitive parts 121 shown in FIG. 3A, there are five connection parts 122. The number of connection parts 122 differs depending on the number of sensitive parts 121. For example, if there are four sensitive parts 121, there are three connection parts 122. Moreover, if there is one sensitive part 121, no connection part 122 is provided. Note that the width of the connection part 122 may be set in accordance with the electrical current, etc., to be applied to the sensitive circuit 12. For example, the width of the connection part 122 may be the same as that of the sensitive part 121.

The terminal parts 123 are provided to one end portion and the other end portion of the sensitive parts 121 connected in series. In FIG. 3A, a terminal part 123a is provided on the lower side of the page, and a terminal part 123b is provided on an upper side of the page. Note that, in the case where the terminal parts 123a and 123b are not distinguished, the terminal parts are referred to as terminal parts 123. The terminal part 123 may have a size capable of connecting the electric wires. Note that, in the sensitive element 10 shown in FIG. 3A, since there are six sensitive parts 121, the terminal parts 123a and 123b are provided on the left side of the page. In the case where the number of sensitive parts 121 is an odd number, the two terminal parts 123a and 123b may be divided to be provided into right and left of the page. Note that the sensitive element 10 may be configured by horizontally flipping.

As described above, the sensitive circuit 12 is configured so that the sensitive parts 121 are windingly connected in series by the connection parts 122, and the electric currents flow from the terminal parts 123a and 123b provided at both end portions of the connected sensitive parts 121. Therefore, it is referred to as the sensitive circuit 12.

The substrate 11 is composed of a non-magnetic material; for example, an electrically-insulated oxide substrate, such as glass or sapphire, a semiconductor substrate, such as silicon, or a metal substrate, such as aluminum, stainless steel, or a nickel-phosphorus-plated metal. Note that, in the case where the substrate 11 is composed of a semiconductor substrate, such as silicon, or a metal substrate, such as aluminum, stainless steel, or a nickel-phosphorus-plated metal, and has high conductivity, an insulating material layer to electrically insulate the substrate 11 from the sensitive circuit 12 may be provided on the surface of the substrate 11 on which the sensitive circuit 12 is to be provided. Examples of the insulating material constituting the insulating material layer include oxide, such as $SiO_2$, $Al_2O_3$, or $TiO_2$, or nitride, such as $Si_2N_4$ or MN. Here, description will be given on the assumption that the substrate 11 is made of glass. In such a substrate 11, the thickness is, for example, 0.3 mm to 2 mm. Note that the thickness may have other values.

As the soft magnetic material constituting the sensitive part 121, an amorphous alloy, which is an alloy containing Co as a main component doped with a high melting point metal, such as Nb, Ta or W, may be used. Examples of the Co alloy constituting the sensitive part 121 include CoNbZr, CoFeTa and CoWZr. The soft magnetic material that constitutes the sensitive part 121 can be formed by the sputtering method.

The connection parts 122 and the terminal parts 123 in the sensitive circuit 12 are formed integrally with the sensitive parts 121. Note that at least one of the connection part 122 and the terminal part 123 may be composed of a conductor. Examples of the conductor composing the aforementioned connection part 122 and terminal part 123 include Ag, Cu, Au, and Al. The connection part 122 and the terminal part 123 may be configured by different conductors. Note that, when the connection parts 122 and the terminal parts 123 are formed integrally with the sensitive parts 121, it is unnecessary to form the connection parts 122 and the terminal parts 123 separately from the sensitive parts 121. It may be possible to form the connection parts 122 and the terminal parts 123 integrally with the sensitive parts 121, and then laminate the conductor on at least one of the connection parts 122 and the terminal parts 123.

In the above, the sensitive part 121 was assumed to be configured with a single layer of the soft magnetic material (referred to as a soft magnetic material layer); however, it may be possible to configure the soft magnetic material layer with two layers, namely, an upper soft magnetic material layer and a lower soft magnetic material layer, and provide an antiferromagnetically coupled layer between the upper soft magnetic material layer and the lower soft magnetic material layer to antiferromagnetically couples (AFC) the upper soft magnetic material layer and the lower soft magnetic material layer. Examples of materials of such an antiferromagnetically coupled layer include Ru. Provision of the antiferromagnetically coupled layer suppresses occurrence of demagnetizing fields and improves the sensitivity of the sensitive element 10.

In addition, a conductor layer that reduces the electrical resistance of the sensitive part 121 may be provided between the upper soft magnetic material layer and the lower soft magnetic material layer constituting the sensitive part 121. As the conductor layer, it is preferable to use metal or an alloy having high conductivity, and is more preferable to use metal or an alloy that is highly conductive and non-magnetic. Examples of materials of such a conductor layer include metal, such as aluminum, copper, and silver. The thickness of the conductor layer is, for example, 10 nm to 500 nm. Provision of the conductor layer can increase the frequency of the alternating current to be applied to the sensitive circuit 12.

Further, a magnetic domain suppression layer that suppresses occurrence of a closure magnetic domain in the upper soft magnetic material layer and the lower soft magnetic material layer may be provided between the upper soft magnetic material layer and the lower soft magnetic material layer constituting the sensitive part 121. Examples of materials of such a magnetic domain suppression layer include non-magnetic materials, such as Ru and $SiO_2$, and non-magnetic amorphous metals, such as CrTi, AlTi, CrB, CrTa, and CoW. By providing the magnetic domain suppression layer, occurrence of the closure magnetic domain in the sensitive parts 121 can be suppressed, and thereby occurrence of noise due to so-called the Barkhausen effect based on magnetic domain wall displacement is also suppressed.

Note that it may be possible to form the soft magnetic material layer constituting the sensitive part 121 to have multiple layers more than two layers, and provide the antiferromagnetically coupled layer, the conductor layer, or the magnetic domain suppression layer between the multiple layers. In addition, it may also be possible to use two or all of the above-described antiferromagnetically coupled layer, conductor layer and magnetic domain suppression layer in combination.

(Action of Sensitive Element 10)

Subsequently, the action of the sensitive element 10 will be described.

Figure 4:
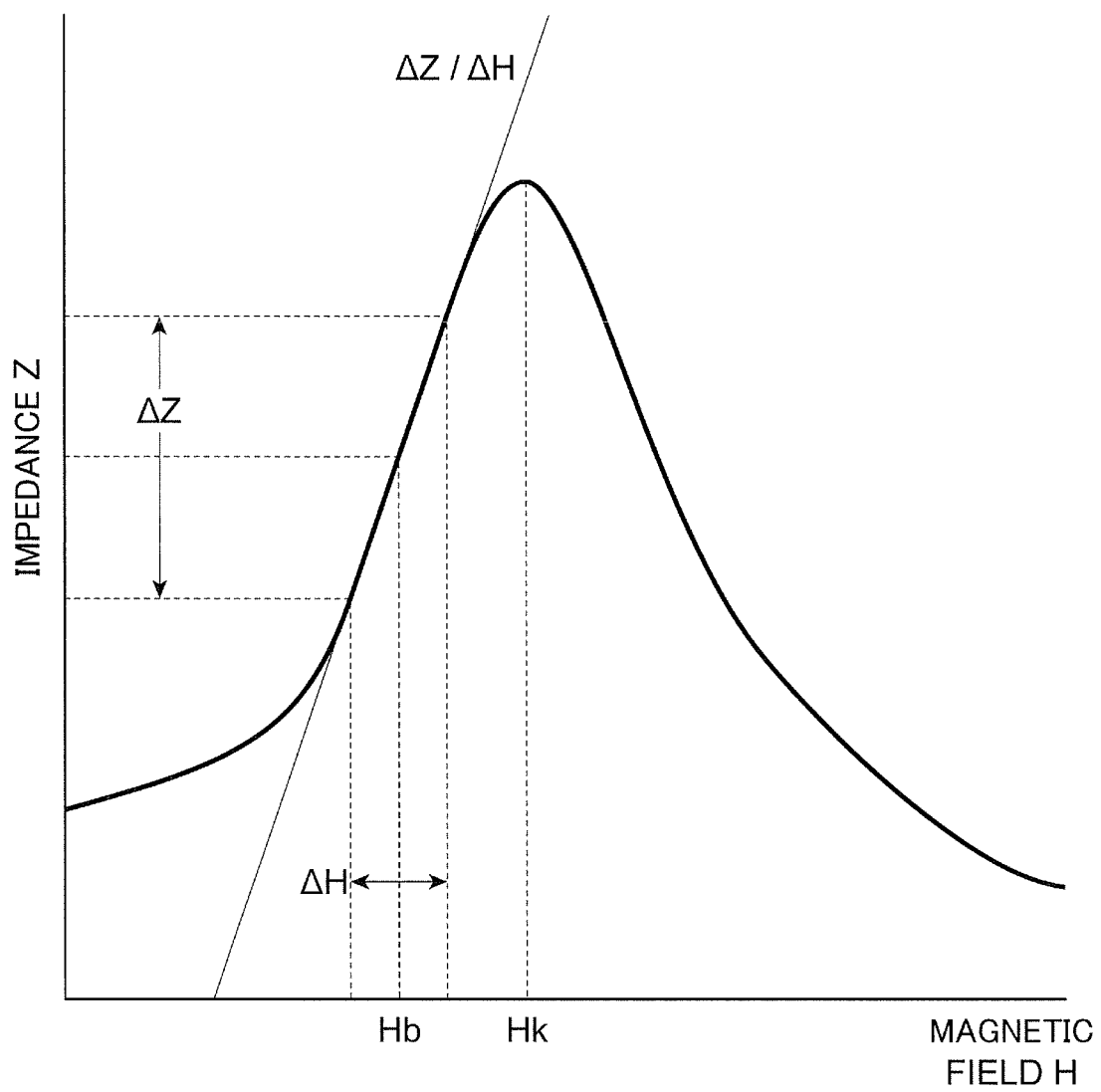
FIG. 4 illustrates a relation between a magnetic field applied in the longitudinal direction of a sensitive part in a sensitive element and an impedance of the sensitive element.

FIG. 4 illustrates a relation between the magnetic field H applied in the longitudinal direction of the sensitive part 121 of the sensitive element 10 and an impedance Z of the sensitive element 10. In FIG. 4, the horizontal axis indicates the magnetic field H, and the vertical axis indicates the impedance Z. Note that the impedance Z is measured by passing the alternating current between the terminal parts 123a and 123b of the sensitive circuit 12 shown in FIG. 3A. Therefore, though the impedance Z is the impedance of the sensitive circuit 12, it is referred to as the impedance Z of the sensitive element 10.

As shown in FIG. 4, the impedance Z of the sensitive element 10 is increased as the magnetic field H applied in the longitudinal direction of the sensitive parts 121 is increased. Then, the impedance Z of the sensitive element 10 is reduced when the magnetic field H to be applied becomes larger than the anisotropic magnetic field Hk. Within the range in which the magnetic field H to be applied is smaller than the anisotropic magnetic field Hk of the sensitive parts 121, by use of a portion where the amount of changes ΔZ in the impedance Z with respect to the amount of changes ΔH in the magnetic field H is steep (ΔZ/ΔH is large), it is possible to extract extremely weak changes in the magnetic field H as the amount of changes ΔZ in the impedance Z. In FIG. 4, the center of the magnetic field H where ΔZ/ΔH is large is shown as the magnetic field Hb. In other words, it is possible to measure the amount of changes (ΔH) in the magnetic field H in the vicinity to the magnetic field Hb (the range indicated by arrows in FIG. 4) with high accuracy. Here, the portion where the amount of changes ΔZ in the impedance Z is the steepest (ΔZ/ΔH is the largest), that is, the amount of changes Zmax of the impedance per unit magnetic field in the magnetic field Hb divided by the impedance Z in the magnetic field Hb (referred to as the impedance Zb) (Zmax/Zb) is the sensitivity. As the sensitivity is higher, the magnetic impedance effect becomes larger and the magnetic field or changes in the magnetic field can be easily measured. To put it another way, the sensitivity becomes higher as the changes in the impedance Z with respect to the magnetic field H are steeper. The magnetic field Hb is referred to as a bias magnetic field in some cases. Hereinafter, the magnetic field Hb is referred to as the bias magnetic field Hb. Note that, as the frequency of the alternating current applied to the sensitive circuit 12 is higher, the sensitivity becomes higher.

(Relation Between Impedance Z and Magnetic Field H of Magnetic Sensors 200 and 210)

Figure 5:
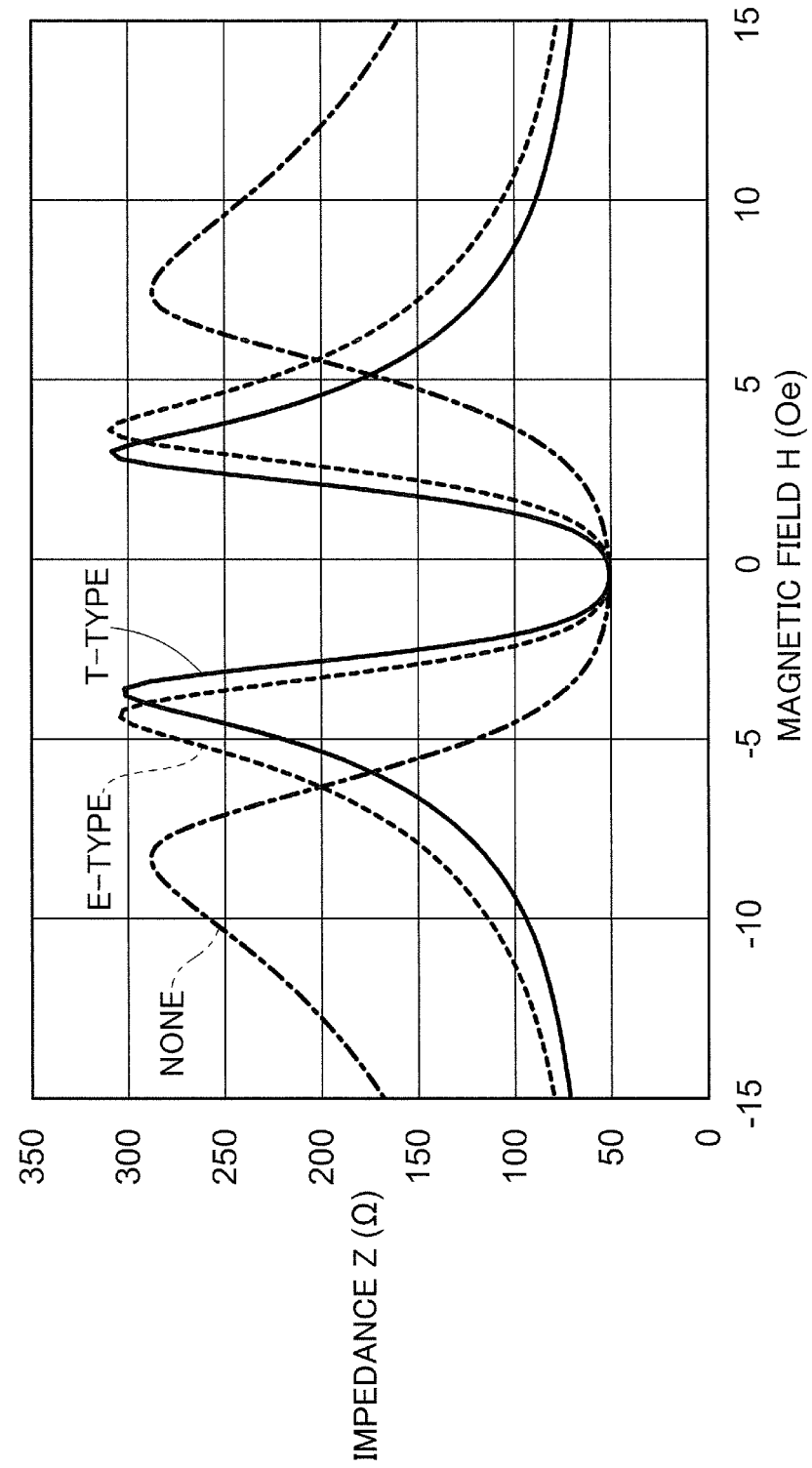
FIG. 5 illustrates a relation between an impedance and a magnetic field in the magnetic sensor to which the first exemplary embodiment is applied.

FIG. 5 illustrates a relation between the impedance Z and the magnetic field H in the magnetic sensors 200 and 210 to which the first exemplary embodiment is applied. In FIG. 5, the horizontal axis indicates the magnetic field H (Oe), and the vertical axis indicates the impedance Z (a). FIG. 5 shows the impedance Z with the magnetic field H in the range of ±15 Oe. Then, FIG. 5 shows, for the purpose of comparison, a magnetic sensor 100 configured with a sensitive element 10 not provided with the focusing member and the diverging member, in addition to the magnetic sensor 200 including the "T-type" focusing member 20 and diverging member 30 and the magnetic sensor 210 including the "E-type" focusing member 21 and diverging member 31. Hereinafter, the magnetic sensor 200 with the "T-type" focusing member 20 and diverging member 30 is referred to as the magnetic sensor 200 ("T-type"), the magnetic sensor 210 with the "E-type" focusing member 21 and diverging member 31 is referred to as the magnetic sensor 210 ("E-type"), and the magnetic sensor 100 configured with the sensitive element 10 without the focusing member and diverging member is referred to as the magnetic sensor 100 ("None"). Then, in FIG. 5, the magnetic sensor 200 ("T-type") is referred to as the "T-type", the magnetic sensor 210 ("E-type") is referred to as the "E-type", and the magnetic sensor 100 ("None") is referred to as the "None". The same is also true in other drawings.

Compared to the magnetic sensor 100 ("None"), the magnetic sensor 200 ("T-type") and the magnetic sensor 210 ("E-type") have a smaller anisotropic magnetic field Hk (refer to FIG. 4) and steep changes in the impedance Z with respect to the magnetic field H. Note that, as compared to the magnetic sensor 210 ("E-type"), the magnetic sensor 200 ("T-type") has a smaller anisotropic magnetic field Hk and more steep changes in the impedance Z with respect to the magnetic field H.

Figure 6:
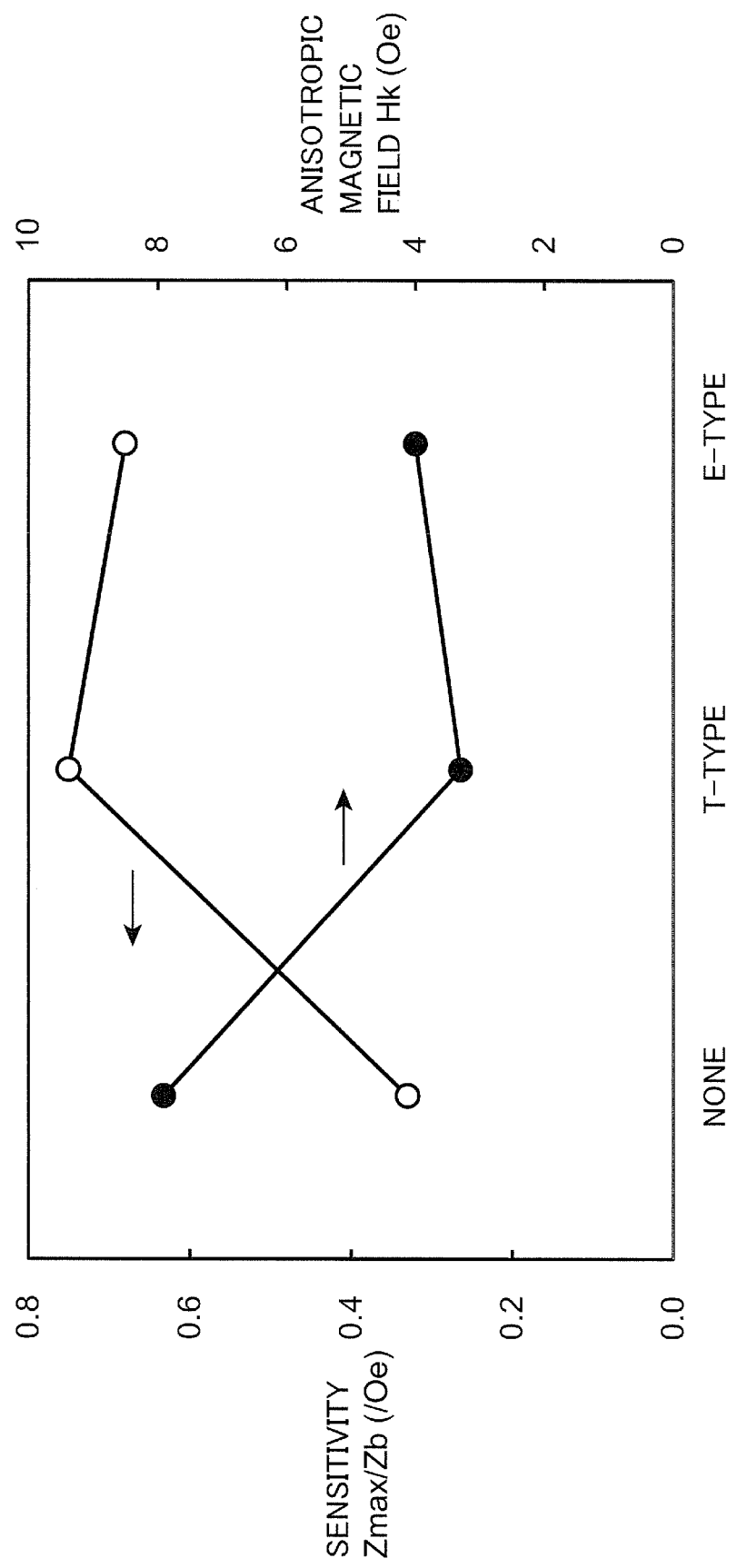
FIG. 6 shows sensitivity and an anisotropic magnetic field of the magnetic sensor to which the first exemplary embodiment applied.

FIG. 6 shows the sensitivity Zmax/Zb and an anisotropic magnetic field Hk of the magnetic sensors 200 and 210 to which the first exemplary embodiment applied. The vertical axis on the left side indicates the sensitivity Zmax/Zb (/Oe), and the vertical axis on the right side indicates the anisotropic magnetic field Hk (Oe). FIG. 6 shows the values of the sensitivity Zmax/Zb and the anisotropic magnetic field Hk extracted from the relation between the impedance Z and the magnetic field H shown in FIG. 5. Note that FIG. 6 shows, for the purpose of comparison, the magnetic sensor 100 ("None") in addition to the magnetic sensor 200 ("T-type") and the magnetic sensor 210 ("E-type").

As shown in FIG. 6, the magnetic sensor 200 ("T-type") and the magnetic sensor 210 ("E-type") have the smaller anisotropic magnetic field Hk and the improved sensitivity Zmax/Zb as compared to the magnetic sensor 100 ("None"). Then it can be understood that the magnetic sensor 200 ("T-type") has a smaller anisotropic magnetic field Hk and more improved sensitivity Zmax/Zb, as compared to the magnetic sensor 210 ("E-type").

This is considered because, as in the magnetic sensors 200 and 210, the sensitive element 10 includes the focusing member and the diverging member, the magnetic flux density passing through the sensitive element 10 is increased, and thereby the magnetic field applied to the sensitive element 10 is also increased.

Figure 7A:
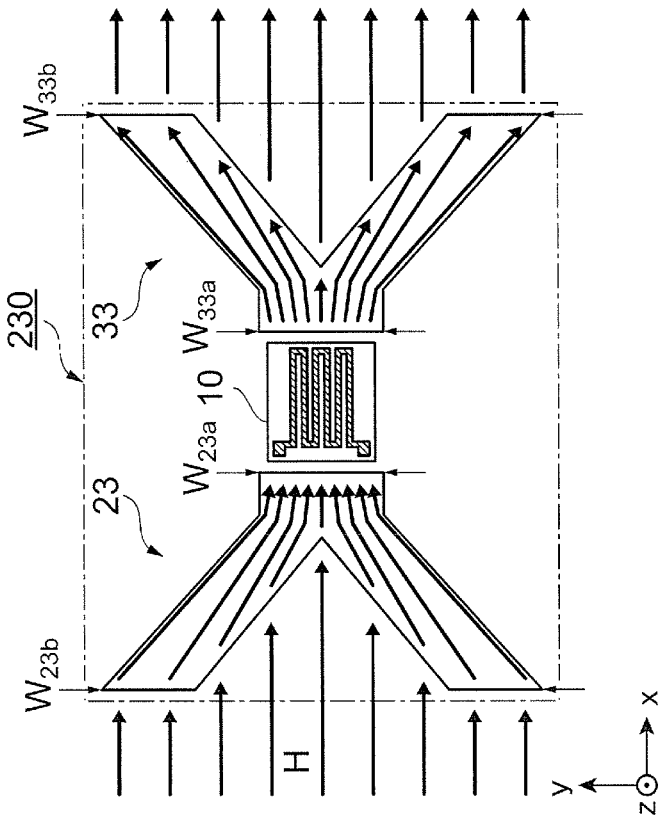
FIGS. 7A and 7B illustrate modified examples of the magnetic sensor to which the first exemplary embodiment is applied, where
Figure 7B:
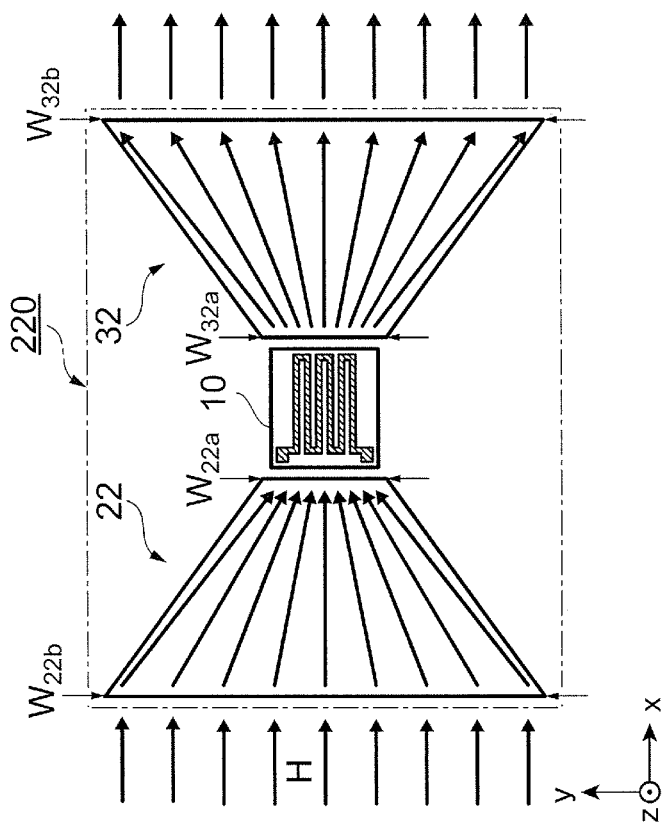

FIGS. 7A and 7B illustrate modified examples of the magnetic sensor 200 to which the first exemplary embodiment is applied. FIG. 7A shows a magnetic sensor 220 including a focusing member 22 and a diverging member 32 with a trapezoidal planar shape, and FIG. 7B shows a magnetic sensor 230 including a focusing member 23 and a diverging member 33 with a Y-shaped planar shape.

As shown in FIG. 7A, the magnetic sensor 220 replaces the focusing member 20 and diverging member 30 with the T-shaped planar shape in the magnetic sensor 200 ("T-type") with the focusing member 22 and diverging member 32 with the trapezoidal planar shape. Accordingly, the magnetic sensor 220 is referred to as the magnetic sensor 220 ("trapezoidal type"). In the focusing member 22, the lower base of the trapezoid is disposed on the side where the magnetic force lines enter from the external space in the −x direction, and the upper base of the trapezoid is disposed on the side facing the sensitive element 10. In the focusing member 22, the width $W_{22a}$ in the y direction of the upper base facing the sensitive element 10 is smaller than the width $W_{22b}$ in the y direction of the lower base where the magnetic force lines enter from the external space ($W_{22a} < W_{22b}$). Similarly, in the diverging member 32, the upper base of the trapezoid is disposed on the side facing the sensitive element 10, and the lower base of the trapezoid is disposed on the side where the magnetic force lines exit to the external space in the +x direction. In the diverging member 32, the width $W_{32a}$ in the y direction of the upper base facing the sensitive element 10 is smaller than the width $W_{32b}$ in the y direction of the lower base where the magnetic force lines exit to the external space ($W_{32a} < W_{32b}$). In other words, the focusing member 22 and the diverging member 32 are arranged symmetrically about the sensitive element 10 in the x direction. This makes the focusing member 22 focus the magnetic force lines from the external space onto the sensitive element 10. In addition, the diverging member 32 diverges and outputs the magnetic force lines passed through the sensitive element 10. As compared to the magnetic sensor 200 ("T-type"), the magnetic sensor 220 ("trapezoidal type") has a smaller magnetic resistance in the focusing member and the diverging member. Note that the planar shape of the focusing member 22 and the diverging member 32 of the magnetic sensor 220 ("trapezoidal type") does not have to be symmetrical in the y direction.

As shown in FIG. 7B, the magnetic sensor 230 replaces the focusing member 20 and diverging member 30 with the T-shaped planar shape in the magnetic sensor 200 ("T-type") with the focusing member 23 and diverging member 33 with the Y-shaped planar shape. Accordingly, the magnetic sensor 230 is referred to as the magnetic sensor 230 ("Y-type"). In the focusing member 23, the spreading portion of Y is disposed on the side where the magnetic force lines enter from the external space in the −x direction, and the narrowing portion of Y is disposed on the side facing the sensitive element 10. In the focusing member 23, the width $W_{23a}$ in the y direction of the side facing the sensitive element 10 is smaller than the width $W_{23b}$ in the y direction of the side where the magnetic force lines enter from the external space ($W_{23a} < W_{23b}$). Similarly, in the diverging member 33, the narrowing portion of Y is disposed on the side facing the sensitive element 10, and the spreading portion of Y is disposed on the side where the magnetic force lines exit to the external space in the +x direction. In the diverging member 33, the width $W_{33a}$ in the y direction of the side facing the sensitive element 10 is smaller than the width $W_{33b}$ in the y direction of the side where the magnetic force lines exit to the external space ($W_{33a} < W_{33b}$). In other words, the focusing member 23 and the diverging member 33 are arranged symmetrically about the sensitive element 10 in the x direction. This makes the focusing member 23 focus the magnetic force lines from the external space onto the sensitive element 10. In addition, the diverging member 33 diverges and outputs the magnetic force lines passed through the sensitive element 10. Note that, in the magnetic sensor 230 ("Y-type"), only one of the focusing member 23 and the diverging member 33 may have the spreading portion of Y. In addition, the focusing member 23 and the diverging member 33 may have a V-shaped planar shape.

As described above, the focusing member focuses the magnetic force lines from the external magnetic field and increases magnetic flux density, to thereby cause the magnetic force lines to pass through the sensitive element 10. The diverging member diverges and outputs the magnetic force lines passed through the sensitive element 10 to the outside. Therefore, like the focusing member 22 of the magnetic sensor 220 in FIG. 7A and the focusing member 23 of the magnetic sensor 230 in FIG. 7B, it is sufficient for the focusing member to focus the magnetic force lines from the external space. In addition, as shown by the diverging member 32 of the magnetic sensor 220 in FIG. 7A and the diverging member 33 of the magnetic sensor 230 in FIG. 7B, it is sufficient for the diverging member to diverge and output the magnetic force lines to the external space.

For that purpose, in the focusing member, the width of the side where the magnetic force lines from the external space enter, namely, the width of the side far from the sensitive element 10, may be wider than the width of the side closer to the sensitive element 10. Similarly, in the diverging member, the width of the side where the magnetic force lines exit to the external space, namely, the width of the side far from the sensitive element 10, may be wider than the width of the side closer to the sensitive element 10.

Second Exemplary Embodiment

In the first exemplary embodiment, the bias magnetic field Hb applied to the sensitive element 10 is superimposed on the external magnetic field from the external space, and then applied. In the second exemplary embodiment, the bias magnetic field Hb is applied by a permanent magnet provided adjacent to or in contact with at least one of the focusing member and the diverging member.

Figure 8:
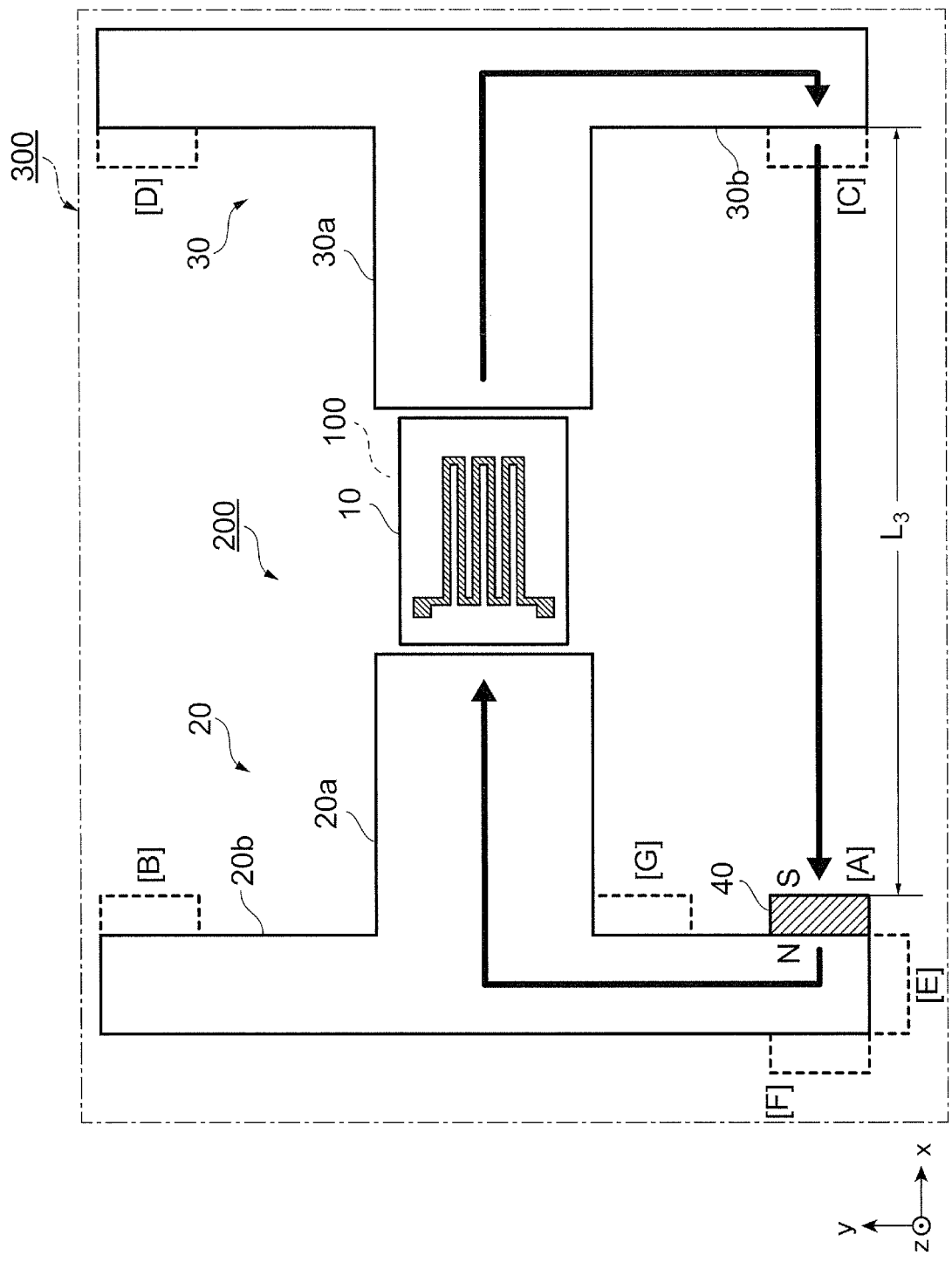
FIG. 8 illustrates a magnetic sensor to which a second exemplary embodiment is applied.

FIG. 8 illustrates a magnetic sensor 300 to which the second exemplary embodiment is applied. The magnetic sensor 300 includes the magnetic sensor 200 shown in FIG. 1 and a permanent magnet 40. Accordingly, portions similar to those of the magnetic sensor 200 shown in FIG. 1 will be assigned with same reference signs, to thereby omit descriptions thereof. As the permanent magnet 40, for example, a disk-shaped permanent magnet can be adopted. As such a permanent magnet 40, for example, a ferrite magnet with a diameter of 1 mm to 5 mm and a thickness of 0.1 mm to 2 mm can be provided. The permanent magnet 40 is an example of a bias magnetic field application member.

In the magnetic sensor 300, the permanent magnet 40 is provided in contact with a side of the end portion, which is closer to the sensitive element 10, in the −y direction of the wide part 20b of the focusing member 20. The location where this permanent magnet 40 is provided is assumed to be position A (in FIG. 8, referred to as [A], and the same applies to others). At this time, the permanent magnet 40 is disposed so that the north pole thereof is located closer to the wide part 20b of the focusing member 20.

As indicated by the thick arrows, the magnetic force lines exited from the north pole of the permanent magnet 40 pass through the sensitive element 10 via the wide part 20b and the facing part 20a of the focusing member 20. Then, the magnetic force lines passed through the sensitive element 10 return to the south pole of the permanent magnet 40 via the facing part 30a and the wide part 30b of the diverging member 30. In other words, the magnetic force lines from the permanent magnet 40 pass through the sensitive element 10 via the focusing member 20 and the diverging member 30, and thereby the bias magnetic field Hb is applied to the sensitive element 10.

Note that, in the magnetic sensors 300 ("T-type+permanent magnet"), the magnetic force lines go through the distance $L_3$ in returning from the wide part 30b of the diverging member 30 to the permanent magnet 40.

Note that, other than the position A, the permanent magnet 40 may be provided to any of: the side surface, which is closer to the sensitive element 10, of the end portion in the +y direction of the wide part 20b of the focusing member 20 (position B); the side surface, which is closer to the sensitive element 10, of the end portion in the −y direction of the wide part 30b of the diverging member 30 (position C); and the side surface, which is closer to the sensitive element 10, of the end portion in the +y direction of the wide part 30b of the diverging member 30 (position D).

In addition, the permanent magnet 40 may be provided to the end portion in the −y direction of the wide part 20b of the focusing member 20 (position E). Further, the permanent magnet 40 may be provided to the side surface, which is on the opposite side of the sensitive element 10, of the end portion in the −y direction of the wide part 20b of the focusing member 20 (position F), or may also be provided to a portion of the side surface, which is closer to the sensitive element 10, of the wide part 20b of the focusing member 20 nearby the facing part 20a (position G). The positions A to G shown here are mere examples, and the permanent magnet 40 may be provided at a portion other than the positions A to G. In addition, plural permanent magnets 40 may be provided to plural positions (the positions A to G, etc.). The plural permanent magnets 40 used in the case may have the same performance or the different performance. Note that, similar to the case shown in FIG. 8, in which the permanent magnet 40 is provided at the position A, the permanent magnets 40 may be disposed so that the magnetic force lines from the permanent magnets 40 pass through the sensitive element 10 to apply the bias magnetic field Hb.

Figure 9:
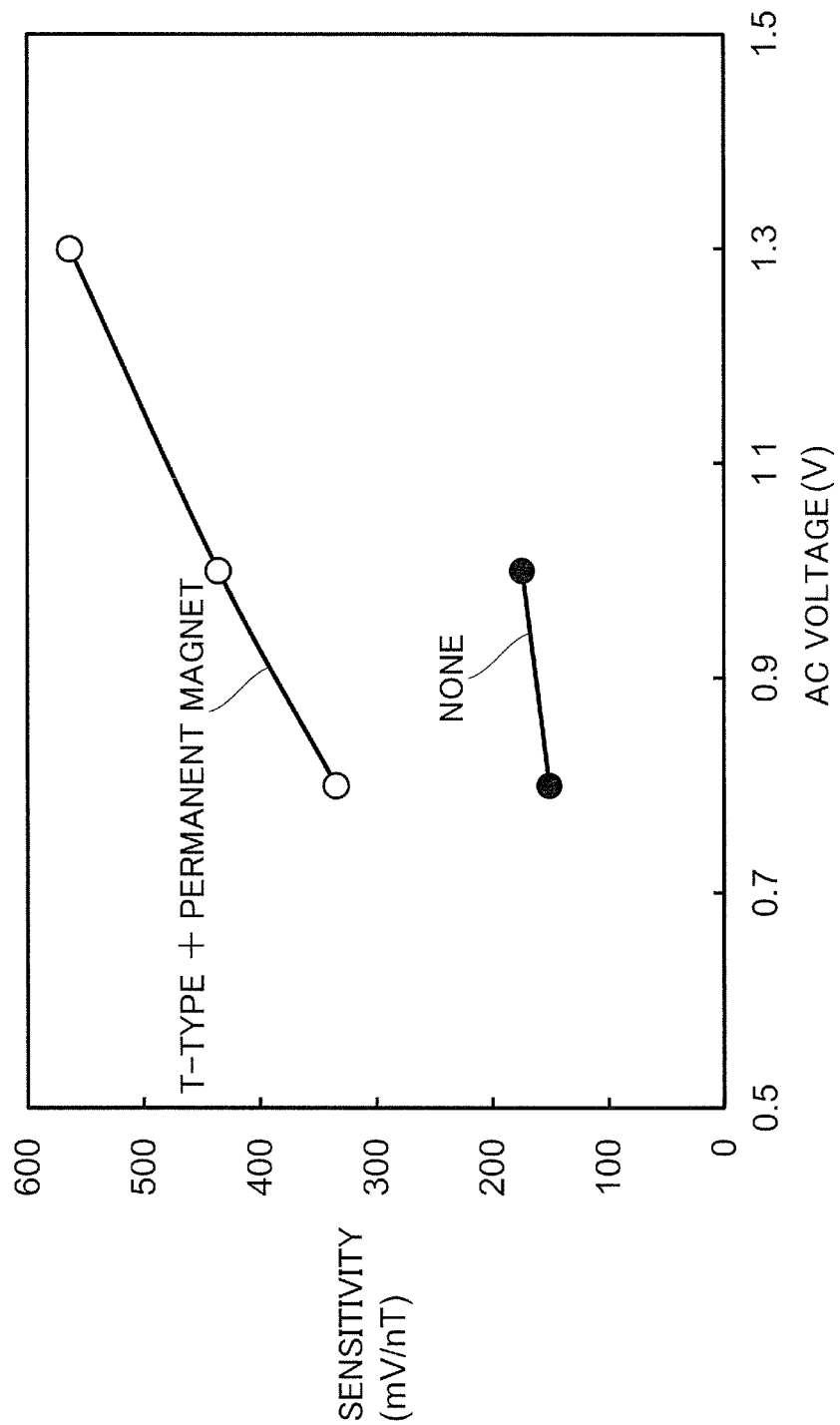
FIG. 9 illustrates detection sensitivity of the magnetic sensor to which the second exemplary embodiment is applied.

FIG. 9 illustrates detection sensitivity of the magnetic sensor 300 to which the second exemplary embodiment is applied. The horizontal axis indicates the AC voltage (V), and the vertical axis indicates the detection sensitivity (mV/nT). Here, the magnetic sensor 300 is referred to as the magnetic sensor 300 ("T-type"+permanent magnet"), and in FIG. 9, referred to as "T-type+permanent magnet". FIG. 9 also shows the magnetic sensor 100 ("None") in addition to the magnetic sensor 300 ("T-type+permanent magnet").

The detection sensitivity means the voltage of the sensitive element 10 per unit magnetic field in the case where the magnetic sensors (the magnetic sensor 300 ("T-type+permanent magnet") and the magnetic sensor 100) are installed in an AM modulation circuit, and the AC voltage is applied thereto.

As shown in FIG. 9, the detection sensitivity of the magnetic sensor 300 ("T-type+permanent magnet") is more than double, as compared to the magnetic sensor 100 ("None").

In addition, while the noise density of the magnetic sensor 100 ("None") is 38 pT/√Hz, the noise density of the magnetic sensor 300 ("T-type+permanent magnet") is 12.4 pT/√Hz, which has nearly tripled.

Figure 10B:
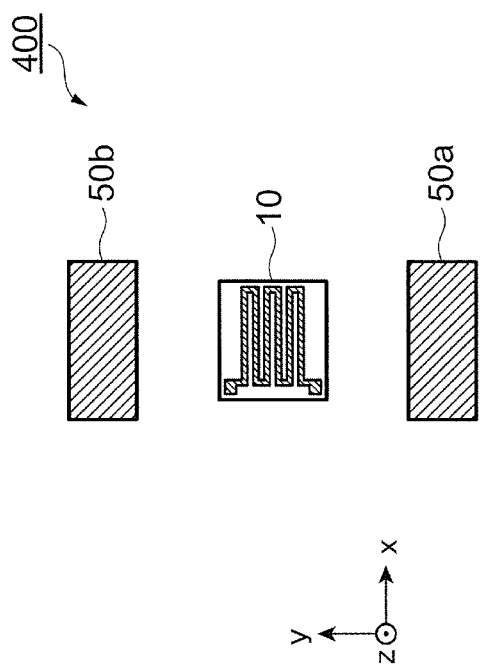
FIGS. 10A and 10B illustrate magnetic sensors in which relation between the application method of the bias magnetic field and noise, where
Figure 10A:
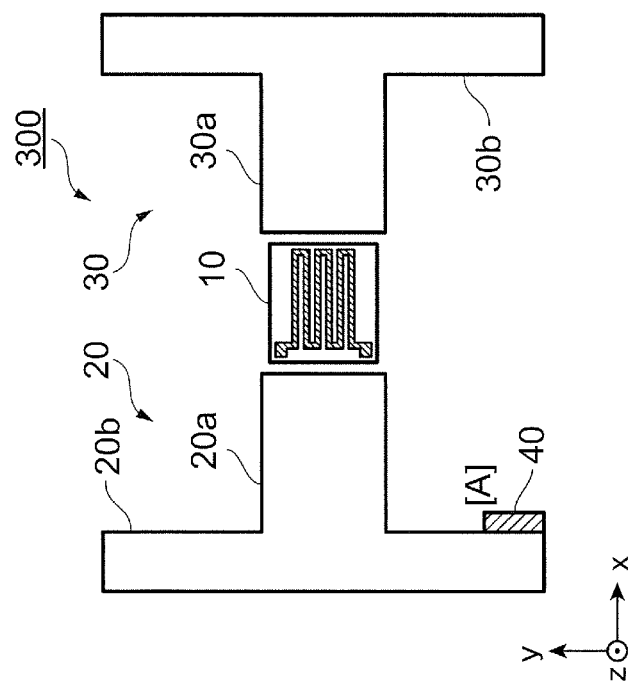

FIGS. 10A and 10B illustrate magnetic sensors by which the relation between the application method of the bias magnetic field Hb and noise. FIG. 10A shows the magnetic sensor 300 including the "T-type" focusing member and diverging member, to which the bias magnetic field Hb is applied by the permanent magnet 40, and FIG. 10B shows a magnetic sensor 400, to which a bias magnetic field Hb is applied by a bonded magnet 50.

FIG. 10A shows the magnetic sensor 300 ("T-type+permanent magnet") shown in FIG. 8, in which the permanent magnet 40 is provided at the position A.

The magnetic sensor 400 in FIG. 10B includes the sensitive element 10 and the bonded magnets 50a and 50b. Then, the bonded magnets 50a and 50b are disposed in the y direction to sandwich the sensitive element 10. Note that, in the case where the bonded magnets 50a and 50b are not distinguished, the bonded magnets 50a and 50b are referred to as the bonded magnets 50. In addition, there are some cases where the bonded magnet 50 is referred to as a bonded magnet. The bonded magnet is a bar-shaped permanent magnet formed by mixing minute magnetic particles or fine powder with a binder such as a resin. Note that the magnetic sensor 400, to which the bias magnetic field Hb is applied by the bonded magnet 50, is referred to as a magnetic sensor 400 ("bonded magnet").

Figure 11A:
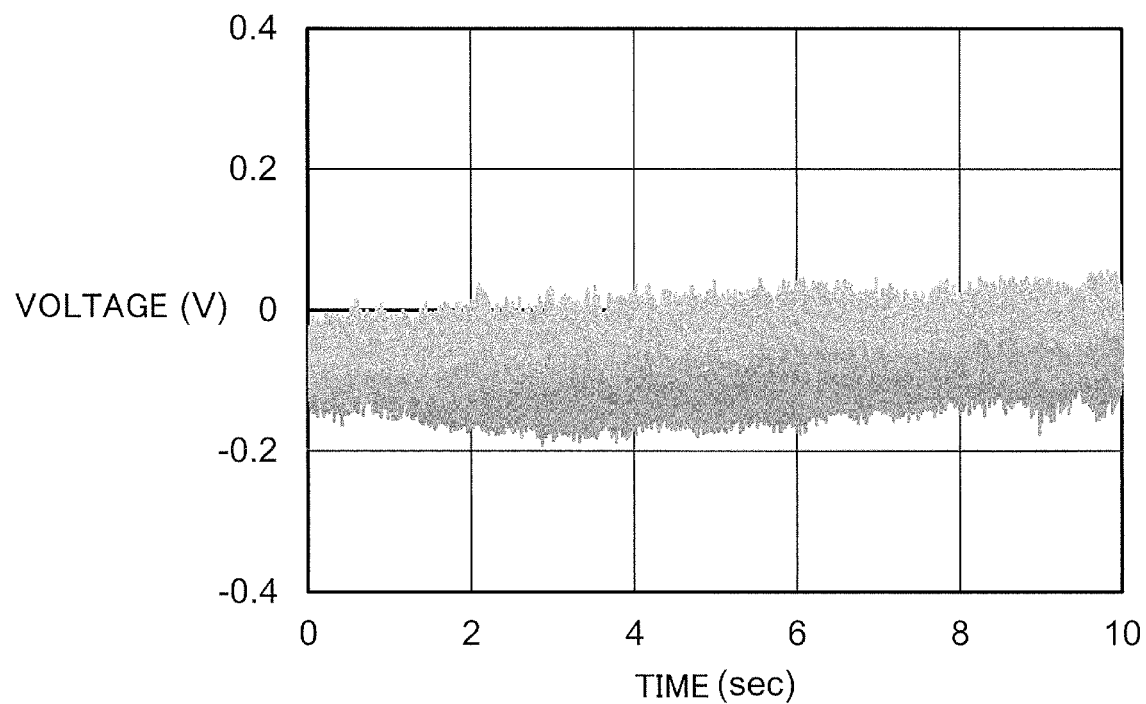
FIGS. 11A and 11B illustrate the noise in the magnetic sensor including the "T-type" focusing member and diverging member, to which the bias magnetic field is applied by the permanent magnet, where
Figure 11B:
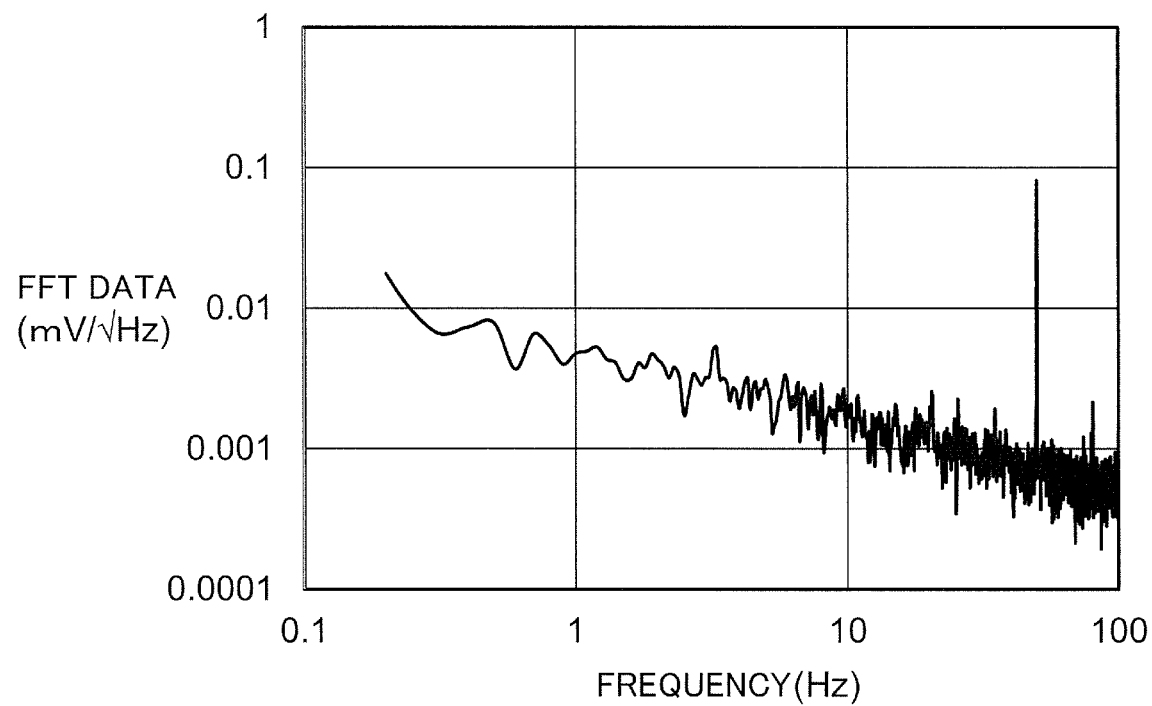

FIGS. 11A and 11B illustrate the noise in the magnetic sensor 300 ("T-type+permanent magnet") that includes the "T-type" focusing member 20 and diverging member 30, to which the bias magnetic field Hb is applied by the permanent magnet 40. FIG. 11A shows time variation in the voltage of the sensitive element 10, and FIG. 11B shows FFT data that is the time variation of the voltage subjected to fast Fourier transform (FFT). In FIG. 11A, the horizontal axis indicates time (sec), and the vertical axis indicates voltage (V). In FIG. 11B, the horizontal axis indicates the frequency (Hz), and the vertical axis indicates the FFT data (mV/√Hz). The voltage of the sensitive element 10 is the voltage of the sensitive element 10 in the case where the sensitive element 10 is connected to the AM modulation circuit and the AC voltage is applied. FIG. 11A shows four measurement results that are superimposed. FIG. 11B shows one of the four measurement results.

Figure 12A:
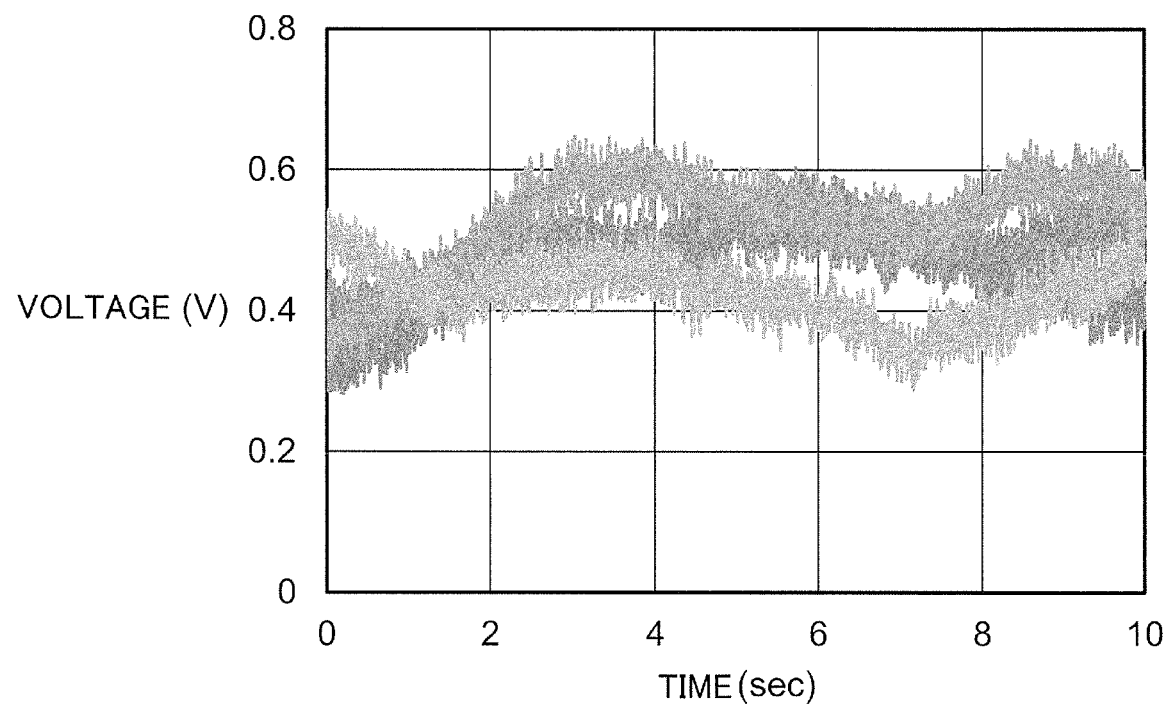
FIGS. 12A and 12B illustrate the noise in the magnetic sensor, to which the bias magnetic field is applied by the bonded magnet, where
Figure 12B:
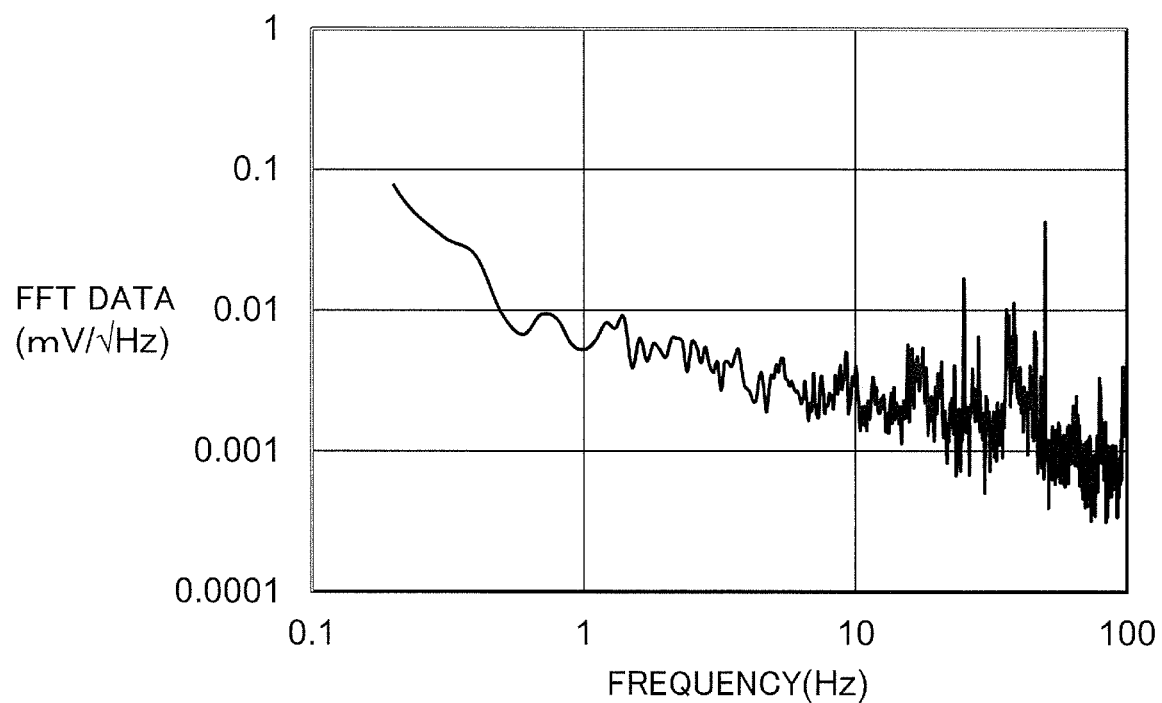

FIGS. 12A and 12B illustrate the noise in the magnetic sensor 400 ("bonded magnet"), to which the bias magnetic field Hb is applied by the bonded magnet 50. FIG. 12A shows time variation in the voltage of the sensitive element 10, and FIG. 12B shows FFT data that is the time variation of the voltage subjected to fast Fourier transform (FFT). In FIG. 12A, the horizontal axis indicates time (sec), and the vertical axis indicates voltage (V). In FIG. 12B, the horizontal axis indicates the frequency (Hz), and the vertical axis indicates the FFT data (mV/√Hz). Note that the voltage of the sensitive element 10 is the same as that of the magnetic sensor 300. Then, FIG. 12A shows four measurement results that are superimposed. FIG. 12B shows one of the four measurement results.

The magnetic sensor 300 ("T-type+permanent magnet") shown in FIG. 11A has less variation (undulation) in the voltage with respect to time as compared to the magnetic sensor 400 ("bonded magnet") shown in FIG. 12A. In other words, in the magnetic sensor 300 ("T-type+permanent magnet"), occurrence of the undulated noise in the voltage with respect to time is suppressed as compared to the magnetic sensor 400 ("bonded magnet"). In the magnetic sensor 300 ("T-type+permanent magnet") shown in FIG. 11A, the stable voltage can be obtained as compared to the magnetic sensor 400 ("bonded magnet") shown in FIG. 12A.

In addition, the magnetic sensor 300 ("T-type+permanent magnet") shown in FIG. 11B has less variation in the FFT data within the frequency of 10 Hz to 100 Hz as compared to the magnetic sensor 400 ("bonded magnet") shown in FIG. 12B. Particularly, in the magnetic sensor 300 ("T-type+permanent magnet") shown in FIG. 11B, the noise generated around 30 Hz in the magnetic sensor 400 ("bonded magnet") shown in FIG. 12B is suppressed. This is considered because, in the magnetic sensor 300 ("T-type+permanent magnet"), the heat capacity of the focusing member 20 and the diverging member 30 is large and stable as compared to the bonded magnet 50.

In the magnetic sensor 400 ("bonded magnet"), the magnetic force lines from the bonded magnet 50 are easily exit to the external space. In contrast thereto, the magnetic sensor 300 ("T-type+permanent magnet") includes the focusing member 20 and the diverging member 30, and the bias magnetic field Hb is applied by the permanent magnet 40; therefore, the magnetic force lines generated from the permanent magnet 40 are easily confined within the focusing member and the diverging member. On the other hand, in the bonded magnet 50, it is considered that the magnetic force lines easily exit to the external space, and the bias magnetic field Hb is apt to vary. Consequently, in the magnetic sensor 300 ("T-type+permanent magnet"), it is considered that occurrence of noise can be suppressed as compared to the magnetic sensor 400 ("bonded magnet").

However, in the magnetic sensor 300 ("T-type+permanent magnet"), when the permanent magnet 40 was disposed in the position E in FIG. 8, the noise larger than those shown in FIGS. 11A and 11B was generated. This is considered because the magnetic force lines generated from the permanent magnet 40 not only be confined within the focusing member 20 and the diverging member 30, but also easily exit to the external space.

Figure 13:
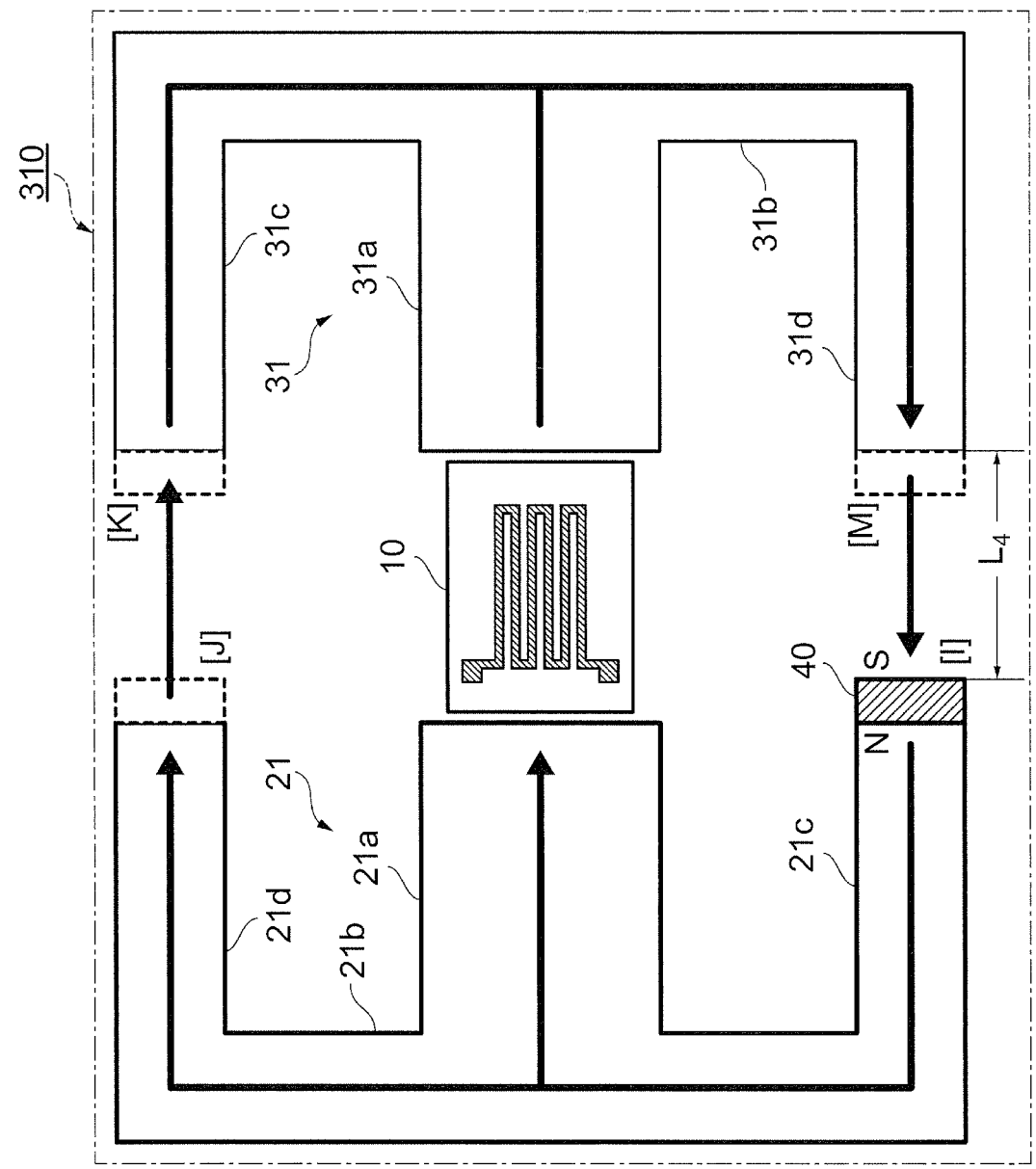
FIG. 13 illustrates another magnetic sensor to which the second exemplary embodiment is applied.

FIG. 13 illustrates another magnetic sensor 310 to which the second exemplary embodiment is applied. The magnetic sensor 310 includes the magnetic sensor 210 ("E-type") shown in FIG. 2 and the permanent magnet 40. Accordingly, portions similar to those of the magnetic sensor 210 ("E-type") shown in FIG. 2 will be assigned with the same reference signs, to thereby omit descriptions thereof. As the permanent magnet 40, similar to the magnetic sensor 300 ("T-type+permanent magnet"), for example, a disk-shaped permanent magnet can be adopted. Therefore, the permanent magnet is referred to as the permanent magnet 40. Accordingly, the magnetic sensor 310 is referred to as the magnetic sensor 310 ("E-type+permanent magnet").

In the magnetic sensor 310, the permanent magnet 40 is provided in contact with the end portion in the +x direction of the extending part 21c of the focusing member 21 (position I). At this time, the permanent magnet 40 is disposed so that the north pole thereof is located closer to the extending part 21c of the focusing member 21. As indicated by the thick arrows, the magnetic force lines exited from the north pole of the permanent magnet 40 pass through the sensitive element 10 via the extending part 21c, the wide part 21b, and the facing part 21a of the focusing member 21. Then, the magnetic force lines passed through the sensitive element 10 return to the south pole of the permanent magnet 40 via the facing part 31a, the wide part 31b, and the extending part 31d of the diverging member 31. In other words, the magnetic force lines from the permanent magnet 40 pass through the sensitive element 10 via the focusing member 21 and the diverging member 31, and thereby the bias magnetic field Hb is applied to the sensitive element 10.

Note that, other than the position I, the permanent magnet 40 may be provided to any of: the end portion in the +x direction of the extending part 21d in the focusing member 21 (position J); the end portion in the −x direction of the extending part 31c of the diverging member 31 (position K); and the end portion in the −x direction of the extending part 31d of the diverging member 31 (position M). Note that the positions I to M are mere examples, and the permanent magnet 40 may be provided at any other position. The plural permanent magnets 40 may be provided to plural positions (the positions I to M, etc.).

Note that the magnetic sensor 310 ("E-type+permanent magnet") shown in FIG. 13 includes the extending parts 21c and 21d in the focusing member 21, and the extending parts 31c and 31d in the diverging member 31. The extending part 21c of the focusing member 21 and the extending part 31d of the diverging member 31 face each other. Similarly, the extending part 21d of the focusing member 21 and the extending part 31c of the diverging member 31 face each other. Consequently, as shown in FIG. 13, the magnetic force lines go through the distance $L_4$ in returning from the extending part 31d of the diverging member 31 to the permanent magnet 40.

On the other hand, in the magnetic sensors 300 ("T-type+permanent magnet") shown in FIG. 8, the magnetic force lines go through the distance $L_3$ in returning from the wide part 30b of the diverging member 30 to the permanent magnet 40. Since the magnetic sensor 310 ("E-type+permanent magnet") includes the extending part 31d in the diverging member 31, the distance $L_4$ is shorter than the distance $L_3$ ($L_4<L_3$). Therefore, as compared to the magnetic sensor 300 ("T-type+permanent magnet"), in the magnetic sensor 310 ("E-type+permanent magnet"), the magnetic force lines returning to the permanent magnet 40 are less likely to leak into the external space. In other words, in the magnetic sensor 310 ("E-type+permanent magnet"), occurrence of noise is more likely to be suppressed, as compared to the magnetic sensor 300 ("T-type+permanent magnet").

The electromagnetic analysis of the magnetic field strength in the portion corresponding to the sensitive element 10 was performed in the magnetic sensor 300 ("T-type+permanent magnet") and the magnetic sensor 310 ("E-type+permanent magnet"). Here, the planar shape of the magnetic sensor 300 ("T-type+permanent magnet") was assumed to be the shape of the magnetic sensor 310 ("E-type+permanent magnet") from which the extending parts 21c and 21d of the focusing member 21 and the extending parts 31c and 31d of the diverging member 31 were removed. Then, the magnetic field strength in the sensitive element 10 was 2.78 times higher in the magnetic sensor 300 ("T" type+permanent magnet") and 2.25 times higher in the magnetic sensor 310 ("E-type+permanent magnet") than the magnetic sensor 100 ("None") including no focusing and diverging members.

This is considered because, in the magnetic sensor 300 ("T-type+permanent magnet"), the magnetic force lines are focused on the facing parts 20a and 30a, whereas in the magnetic sensor 310 ("E-type+permanent magnet"), the magnetic force lines are focused on the facing parts 21a and 31a, and in addition, also focused on the extending parts 21c, 21d, 31c, and 31d (refer to FIGS. 1 and 2).

However, in the case where plural magnetic sensors are arranged to be used, there is a risk that the bias magnetic field Hb used in each magnetic sensor affects other arranged magnetic sensors. In such a case, it is recommended to use the magnetic sensor 310 (type E+permanent magnet), which is less likely to leak the bias magnetic field Hb.

Note that, in the magnetic sensor 300 ("T-type+permanent magnet") and the magnetic sensor 310 ("E-type+permanent magnet"), the permanent magnet 40 was provided in contact with at least one of the focusing member and the diverging member, but the permanent magnet 40 may be provided nearby at least one of the focusing member and the diverging member.

Further, the permanent magnet 40 that applies the bias magnetic field Hb to the sensitive element 10 may be provided nearby or in contact with at least one of the focusing member 22 and the diverging member 32 with the trapezoidal planar shape of the magnetic sensor 220 shown in FIG. 7A, or may be provided nearby or in contact with at least one of the focusing member 23 and the diverging member 33 with the Y-shaped planar shape of the magnetic sensor 230 shown in FIG. 7B.

So far, the exemplary embodiments according to the present invention have been described, but the present invention is not limited to the exemplary embodiments. The focusing member and the diverging member shown in each of the magnetic sensors 200, 210, 220, 230, 300, and 310, to which the exemplary embodiments are applied, may be used in combination.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A magnetic sensor comprising:
   a sensitive element configured to sense a magnetic field by a magnetic impedance effect; and
   a focusing member comprising a soft magnetic material, wherein the focusing member is configured to face the sensitive element and to focus one or more magnetic force lines from an outside of the magnetic sensor onto the sensitive element,
   wherein the focusing member further comprises:
      a facing part facing the sensitive element;
      a wide part provided on a side of the focusing member where the one or more magnetic force lines enter from the outside, the wide part of the focusing member comprising a central portion, a first end portion, and a second end portion;
      a first extending part extending from the first end portion of the wide part of the focusing member in a direction parallel to the one or more magnetic force lines; and
      a second extending part extending from the second end portion of the wide part of the focusing member in a direction parallel to the one or more magnetic force lines.

2. The magnetic sensor of claim 1, wherein a width of the side of the focusing member where the one or more magnetic force lines enter from the outside is wider than a width of the facing part in a direction intersecting a direction of the one or more magnetic force lines entering from the outside.

3. The magnetic sensor of claim 1, further comprising
   a bias magnetic field application member, wherein the bias magnetic field application member is configured to be in contact with or nearby the focusing member and to apply a bias magnetic field to the sensitive element via the focusing member.

4. The magnetic sensor of claim 1, further comprising:
   a diverging member comprising a soft magnetic material, wherein the diverging member is configured to face the sensitive element and to diverge the one or more magnetic force lines passed through the sensitive element from the outside.

5. The magnetic sensor of claim 4, wherein a width of a side of the diverging member where the one or more magnetic force lines exits to the outside is wider than a width of a side of the diverging member facing the sensitive element in a direction intersecting a direction of the one or more magnetic force lines from the outside.

6. The magnetic sensor of claim 4, wherein
   the diverging member further comprises:
   a facing part facing the sensitive element; and
   a wide part provided on a side of the diverging member where the one or more magnetic force lines exit to the outside, wherein a width of the wide part in a direction intersecting a direction of the one or more magnetic force lines is wider than a width of the facing part.

7. The magnetic sensor of claim 4, wherein
   the diverging member further comprises:
   a facing part facing the sensitive element;
   a wide part provided on a side of the diverging member where the one or more magnetic force lines exit to the outside, the wide part of the diverging member comprising a central portion, a first end portion, and a second end portion;
   a first extending part extending from the first end portion of the wide part of the diverging member in a direction parallel to the one or more magnetic force lines; and
   a second extending part extending from the second end portion of the wide part of the diverging member in a direction parallel to the one or more magnetic force lines,
   wherein a width of the wide part of the diverging member is wider than a width of the facing part of the diverging member in a direction intersecting a direction of the one or more magnetic force lines from the outside.

8. The magnetic sensor of claim 4, further comprising:
   a bias magnetic field application member, wherein the bias magnetic field application member is configured to be in contact with or nearby the diverging member and to apply a bias magnetic field to the sensitive element via the diverging member.

9. The magnetic sensor of claim 4, wherein
   the sensitive element comprises a substrate and a sensitive circuit, and the focusing member and the diverging member are provided outside the substrate.

10. A magnetic sensor comprising:
a sensitive element configured to sense a magnetic field by a magnetic impedance effect; and
a focusing member comprising a soft magnetic material, the focusing member further comprising:
  a first rectangular portion, the first rectangular portion comprising a first side, a second side, a third side, and a fourth side; and
  a second rectangular portion, the second rectangular portion comprising a first side, a second side, a third side, and a fourth side,
wherein the first side of the first rectangular portion and the second side of the first rectangular portion have a first length, the third side of the first rectangular portion and the fourth side of the first rectangular portion have a second length, and the first length is greater than the second length,
wherein the first side of the second rectangular portion and the second side of the second rectangular portion have a third length, the third side of the second rectangular portion and the fourth side of the second rectangular portion have a fourth length, the third length is less than the fourth length, and the third length is less than the first length,
wherein the first side of the second rectangular portion is connected with the second side of the first rectangular portion such that the first rectangular portion and the second rectangular portion form a "T" shape, and
wherein the second side of the second rectangular portion faces the sensitive element and the focusing member is configured to receive an one or more magnetic force lines through the first rectangular portion and to focus the one or more magnetic force lines through the second rectangular portion and onto the sensitive element.

11. The magnetic sensor of claim 10, further comprising a bias magnetic field application member,
wherein the bias magnetic field application member is disposed on at least one of the third side of the first rectangular portion and the fourth side of the first rectangular portion, and the bias magnetic field application member is configured to apply a bias magnetic field to the sensitive element via the focusing member.

12. The magnetic sensor of claim 10, wherein the focusing member further comprises:
  a third rectangular portion, the third rectangular portion comprising a first side, a second side, a third side, and a fourth side; and
  a fourth rectangular portion, the fourth rectangular portion comprising a first side, a second side, a third side, and a fourth side;
wherein the first side of the third rectangular portion and the second side of the third rectangular portion have a fifth length, the third side of the third rectangular portion and the fourth side of the third rectangular portion have a sixth length, and the fifth length is less than the sixth length,
wherein the first side of the fourth rectangular portion and the second side of the fourth rectangular portion have a seventh length, the third side of the fourth rectangular portion and the fourth side of the fourth rectangular portion have an eighth length, and the seventh length is less than the eighth length,
wherein the first rectangular portion further comprises a top portion, a central portion, and a bottom portion, and the fifth length and the sixth length are less than the first length, and
wherein the first side of the third rectangular portion is connected with the top portion of the first rectangular portion on the second side of the first rectangular portion, the first side of fourth rectangular portion is connected with the bottom portion of the first rectangular portion on the second side of the first rectangular portion, and the first side of the second rectangular portion is connected with the central portion of the first rectangular portion on the second side of the first rectangular portion such that the first rectangular portion, the second rectangular portion, the third rectangular portion, and the forth rectangular portion form an "E" shape.

13. The magnetic sensor of claim 12, further comprising a bias magnetic field application member,
wherein the bias magnetic field application member is disposed on at least one of the second side of the third rectangular portion and the second side of the fourth rectangular portion, and the bias magnetic field application member is configured to apply a bias magnetic field to the sensitive element via the focusing member.

14. The magnetic sensor of claim 10, further comprising a diverging member comprising a soft magnetic material, wherein the diverging member is symmetrical with the focusing member across an axis bisecting the sensitive element in a direction perpendicular to the one or more magnetic force lines passing through the sensitive element.

15. The magnetic sensor of claim 12, further comprising a diverging member comprising a soft magnetic material, wherein the diverging member is symmetrical with the focusing member across an axis bisecting the sensitive element in a direction perpendicular to the one or more magnetic force lines passing through the sensitive element.

* * * * *